United States Patent
Li

(10) Patent No.: US 7,510,943 B2
(45) Date of Patent: Mar. 31, 2009

(54) SEMICONDUCTOR DEVICES AND METHODS OF MANUFACTURE THEREOF

(75) Inventor: Hong-Jyh Li, Austin, TX (US)

(73) Assignee: Infineon Technologies AG, Munich (DE)

( * ) Notice: Subject to any disclaimer, the term of this patent is extended or adjusted under 35 U.S.C. 154(b) by 588 days.

(21) Appl. No.: 11/305,567

(22) Filed: Dec. 16, 2005

(65) Prior Publication Data

US 2007/0141797 A1    Jun. 21, 2007

(51) Int. Cl.
*H01L 21/336* (2006.01)

(52) U.S. Cl. .............. 438/301; 438/199; 438/216; 438/218; 438/240; 438/258; 438/264; 438/275; 438/283; 438/300; 257/E21.632; 257/E21.633

(58) Field of Classification Search .......... 438/218, 438/222, 225, 226, 249
See application file for complete search history.

(56) References Cited

U.S. PATENT DOCUMENTS

| 4,432,035 | A | 2/1984 | Hsieh et al. |
|---|---|---|---|
| 4,990,974 | A | 2/1991 | Vinal |
| 5,041,885 | A | 8/1991 | Gualandris et al. |
| 5,066,995 | A | 11/1991 | Young et al. |
| 5,162,263 | A | 11/1992 | Kunishima et al. |
| 5,321,287 | A | 6/1994 | Uemura et al. |
| 5,352,631 | A | 10/1994 | Sitaram et al. |
| 5,763,922 | A | 6/1998 | Chau |
| 5,994,747 | A | 11/1999 | Wu |
| 6,020,243 | A | 2/2000 | Wallace et al. |
| 6,027,961 | A * | 2/2000 | Maiti et al. ............ 438/199 |
| 6,033,944 | A | 3/2000 | Shida |
| 6,048,769 | A | 4/2000 | Chau |

(Continued)

FOREIGN PATENT DOCUMENTS

EP    1 298 722 A2    4/2003

(Continued)

OTHER PUBLICATIONS

"Front End Processes," The International Technology Roadmap for Semiconductors: 2002 Update, pp. 45-62, http://member.itrs.net/.

(Continued)

*Primary Examiner*—N Drew Richards
*Assistant Examiner*—Kyoung Lee
(74) *Attorney, Agent, or Firm*—Slater & Matsil, L.L.P.

(57) ABSTRACT

A first gate dielectric of a first transistor is disposed over a workpiece in a first region, and a second gate dielectric of a second transistor is disposed over the workpiece in a second region. The second gate dielectric comprises a different material than the first gate dielectric. A first dopant-bearing metal comprising a first dopant is disposed in recessed regions of the workpiece proximate the first gate dielectric, and a second dopant-bearing metal comprising a second dopant is disposed in recessed regions of the workpiece proximate the second gate dielectric. A first doped region comprising the first dopant is disposed in the workpiece adjacent the first dopant-bearing metal. A second doped region comprising the second dopant is disposed in the workpiece adjacent the second dopant-bearing metal. The dopant-bearing metals and the doped regions comprise source and drain regions of the first and second transistors.

16 Claims, 13 Drawing Sheets

U.S. PATENT DOCUMENTS

| | | | |
|---|---|---|---|
| 6,084,280 | A | 7/2000 | Gardner et al. |
| 6,124,171 | A | 9/2000 | Arghavani et al. |
| 6,159,782 | A | 12/2000 | Xiang et al. |
| 6,171,910 | B1 | 1/2001 | Hobbs et al. |
| 6,184,072 | B1 | 2/2001 | Kaushik et al. |
| 6,225,163 | B1 | 5/2001 | Bergemont |
| 6,291,867 | B1 | 9/2001 | Wallace et al. |
| 6,348,390 | B1 | 2/2002 | Wu |
| 6,373,111 | B1 | 4/2002 | Zheng et al. |
| 6,410,967 | B1 | 6/2002 | Hause et al. |
| 6,444,555 | B2 | 9/2002 | Ibok |
| 6,448,127 | B1 | 9/2002 | Xiang et al. |
| 6,475,908 | B1 | 11/2002 | Lin et al. |
| 6,492,217 | B1 | 12/2002 | Bai et al. |
| 6,528,858 | B1 | 3/2003 | Yu et al. |
| 6,563,183 | B1 | 5/2003 | En et al. |
| 6,656,764 | B1 | 12/2003 | Wang et al. |
| 6,693,333 | B1 | 2/2004 | Yu |
| 6,716,685 | B2 | 4/2004 | Lahaug |
| 6,720,221 | B1 | 4/2004 | Ahn et al. |
| 6,737,313 | B1 | 5/2004 | Marsh et al. |
| 6,740,944 | B1 | 5/2004 | McElheny et al. |
| 6,852,645 | B2 | 2/2005 | Colombo et al. |
| 6,855,605 | B2 | 2/2005 | Jurczak et al. |
| 6,890,807 | B2 | 5/2005 | Chau et al. |
| 6,897,095 | B1 | 5/2005 | Adetutu et al. |
| 6,921,691 | B1 | 7/2005 | Li et al. |
| 7,060,568 | B2 | 6/2006 | Metz et al. |
| 7,091,588 | B2 | 8/2006 | Hegde et al. |
| 7,348,284 | B2 | 3/2008 | Doyle et al. |
| 7,361,958 | B2 | 4/2008 | Brask et al. |
| 2001/0012653 | A1 | 8/2001 | Tsukamoto |
| 2002/0005556 | A1 | 1/2002 | Cartier et al. |
| 2002/0053711 | A1 | 5/2002 | Chau et al. |
| 2002/0090773 | A1 | 7/2002 | Bojarczuk, Jr. et al. |
| 2002/0098649 | A1 | 7/2002 | Chien et al. |
| 2002/0099766 | A1 | 7/2002 | Tuli |
| 2002/0135030 | A1 | 9/2002 | Horikawa |
| 2002/0135048 | A1 | 9/2002 | Ahn et al. |
| 2002/0151125 | A1 | 10/2002 | Kim et al. |
| 2002/0153573 | A1 | 10/2002 | Mogami |
| 2003/0057432 | A1 | 3/2003 | Gardner et al. |
| 2003/0099766 | A1 | 5/2003 | Jurczak et al. |
| 2003/0104663 | A1 | 6/2003 | Visokay et al. |
| 2003/0116804 | A1 | 6/2003 | Visokay et al. |
| 2003/0137017 | A1 | 7/2003 | Hisamoto et al. |
| 2003/0141560 | A1 | 7/2003 | Sun |
| 2003/0203560 | A1 | 10/2003 | Ryu et al. |
| 2003/0219953 | A1 | 11/2003 | Mayuzumi |
| 2004/0000695 | A1 | 1/2004 | Matsuo |
| 2004/0005749 | A1 | 1/2004 | Choi et al. |
| 2004/0009675 | A1 | 1/2004 | Eissa et al. |
| 2004/0023462 | A1 | 2/2004 | Rotondaro et al. |
| 2004/0132271 | A1 | 7/2004 | Ang et al. |
| 2004/0171222 | A1 | 9/2004 | Gao et al. |
| 2004/0180487 | A1 | 9/2004 | Eppich et al. |
| 2004/0217429 | A1 | 11/2004 | Lin et al. |
| 2004/0242021 | A1 | 12/2004 | Kraus et al. |
| 2005/0035345 | A1 | 2/2005 | Lin et al. |
| 2005/0064663 | A1 | 3/2005 | Saito |
| 2005/0098839 | A1 | 5/2005 | Lee et al. |
| 2005/0101159 | A1 | 5/2005 | Droopad |
| 2005/0139926 | A1 | 6/2005 | Shimizu et al. |
| 2005/0224897 | A1 | 10/2005 | Chen et al. |
| 2005/0245019 | A1 | 11/2005 | Luo et al. |
| 2005/0280104 | A1 | 12/2005 | Li |
| 2006/0003507 | A1 | 1/2006 | Jung et al. |
| 2006/0017112 | A1 | 1/2006 | Wang et al. |
| 2006/0038236 | A1 | 2/2006 | Yamamoto |
| 2006/0118879 | A1 | 6/2006 | Li |
| 2006/0125018 | A1 | 6/2006 | Lee et al. |
| 2006/0131652 | A1 | 6/2006 | Li |
| 2006/0141729 | A1 | 6/2006 | Wang et al. |
| 2006/0211195 | A1 | 9/2006 | Luan |
| 2006/0223335 | A1 | 10/2006 | Mathew et al. |
| 2006/0275975 | A1 | 12/2006 | Yeh et al. |
| 2006/0292773 | A1 | 12/2006 | Goolsby et al. |
| 2007/0018245 | A1 | 1/2007 | Jeng |
| 2007/0020903 | A1 | 1/2007 | Takehara et al. |
| 2007/0034945 | A1 | 2/2007 | Bohr et al. |

FOREIGN PATENT DOCUMENTS

| | | |
|---|---|---|
| EP | 1 388 889 A2 | 2/2004 |
| EP | 1 531 496 A2 | 5/2005 |
| JP | 2002118175 | 4/2002 |
| JP | 2004289061 | 10/2004 |
| WO | WO 01/66832 A2 | 9/2001 |
| WO | WO 2004/095556 A1 | 11/2004 |
| WO | WO 2005/114718 A1 | 12/2005 |
| WO | WO 2006/061371 A1 | 6/2006 |
| WO | WO 2006/067107 A1 | 6/2006 |

OTHER PUBLICATIONS

"Front End Processes," The International Technology Roadmap for Semiconductors: 2003 Edition, pp. 23-25, http://member.itrs.net/.

Gannavaram, S., et al., "Low Temperature ($\leq$ 800° C.) Recessed Junction Selective Silicon-Germanium Source/Drain Technology for sub-70 nm CMOS," 2000, 4 pp., IEEE, Los Alamitos, CA.

Guha, S., et al., "Atomic Beam Deposition of Lanthanum- and Yttrium-Based Oxide Thin Films for Gate Dielectrics," Applied Physics Letters, Oct. 23, 2000, pp. 2710-2712, vol. 77, No. 17, American Institute of Physics, Melville, NY.

"High κ Dielectric Materials," Tutorial: Materials for Thin Films / Microelectronics, http://www.sigmaaldrich.com/Area_of_Interest/Organic_Inorganic_Chemistry/Materials_Science/Thin_Films_Microelectronics/Tutorial/Dielectric_Materials.html, downloaded Jun. 9, 2004, 3 pp., Sigma-Aldrich Co., St. Louis, MO.

Hobbs, C., et al., "Fermi Level Pinning at the PolySi/Metal Oxide Interface," 2003 Symposium on VLSI Technology Digest of Technical Papers, Jun. 2003, 2 pp., IEEE, Los Alamitos, CA.

Huang, F.-J., et al., "Schottky-Clamped NMOS Transistors Implemented in a Conventional 0.8-μm CMOS Process," IEEE Electron Device Letters, Sep. 1998, pp. 326-328, vol. 19, No. 9, IEEE, Los Alamitos, CA.

Muller, R.S., et al., "Device Electronics for Integrated Circuits," Second Ed., 1986, pp. 380-385, 398-399, John Wiley & Sons, New York, NY.

Park, D.-G., et al., "Thermally Robust Dual-Work Function ALD-MN$_x$ MOSFETs using Conventional CMOS Process Flow," 2004 Symposium on VLSI Technology Digest of Technical Papers, 2004, pp. 186-187, IEEE, Los Alamitos, CA.

Samavedam, S.B., et al., "Fermi Level Pinning with Sub-Monolayer MeOx and Metal Gates," Mar. 2003, 4 pp., IEEE, Los Alamitos, CA.

Wolf, S., "Silicon Processing for the VLSI Era: vol. II—CMOS Process Integration," 1990, pp. 432-441, Lattice Press, Sunset Beach, CA.

Li, H.-J., et al., "Dual High-κ Gate Dielectric with Poly Gate Electrode: HfSiON on nMOS and Al$_2$O$_3$ Capping Layer on pMOS," IEEE Electron Device Letters, vol. 26, No. 7, Jul. 2005, pp. 441-444.

Lin, R., et al., "An Adjustable Work Function Technology Using Mo Gate for CMOS Devices," IEEE Electron Device Letters, Jan. 2002, pp. 49-51, vol. 23, No. 1, IEEE, Los Alamitos, CA.

Wakabayashi, H., et al., "A Dual-Metal Gate CMOS Technology Using Nitrogen-Concentration-Controlled TiNx Film," IEEE Transactions on Electron Devices, Oct. 2001, pp. 2363-2369, vol. 48, No. 10, IEEE, Los Alamitos, CA.

Gao, W., et al., "Stacked Metal Layers as Gates for MOSFET Threshold Voltage Control," Materials Research Society Symposium, 2003, pp. 3-8, vol. 765.

Li, T.L., et al., "Continuous and Precise Work Function Adjustment for Integratable Dual Metal Gate CMOS Technology Using Hf-Mo Binary Alloys," IEEE Transactions on Electron Devices, Jun. 2005, pp. 1172-1179, vol. 52, No. 6.

Polishchuk, I., et al., "Dual Work Function Metal Gate CMOS Transistors Fabricated by Ni-Ti Interdiffusion," IEEE Electron Device Letters, Apr. 2002, pp. 411-414, vol. 23, Issue 4.

Aoyama, T., et al., "Proposal of New HfSiON CMOS Fabrication Process (HAMDAMA) for Low Standby Power Device," IEDM Technical Digest, Dec. 2004, pp. 95-98.

Yeo, Y.C., et al., "Dual-Metal Gate CMOS Technology with Ultrathin Silicon Nitride Gate Dielectric," IEEE Electron Device Letters, May 2001, pp. 227-229, vol. 22, Issue 5.

Polishchuk, I., et al., "Polycrystalline Silicon/Metal Stacked Gate for Threshold Voltage Control in Metal-Oxide-Semiconductor Field-Effect Transistors," Applied Physics Letters, Apr. 3, 2000, pp. 1938-1940, vol. 76, No. 14, 2000 American Institute of Physics.

Samavedam, S.B., et al., "Evaluation of Candidate Metals for Dual-Metal Gate CMOS with $HfO_2$ Gate Dielectric," Materials Research Society Symposium, 2002, pp. 85-90, vol. 716, Materials Research Society.

Wolf, S., et al., "Silicon Processing for the VLSI Era: vol. I—Process Technology," pp. 388 and 526, Second Edition, Lattice Press, Sunset Beach, CA.

Cho, B., et al. "HfSi Gate Electrode with Tunable Work Function for Advanced CMOS Devices," http://web.archive.org/web/20040814183959/http://www.eng.nus.edu.sg/EResnews/0406/rd/rd_7.html, Aug. 2004.

Choi, K., et al., "Growth Mechanism of TiN Film on Dielectric Films and the Effects on the Work Function," Thin Solid Film 486, 2005, pp. 141-144, Elsevier.

Hobbs, C.C., et al., "Fermi-Level Pinning at the Polysilicon/Metal Oxide Interface—Part I," IEEE Transactions on Electron Devices, vol. 51, No. 6, Jun. 2004, pp. 971-977.

* cited by examiner

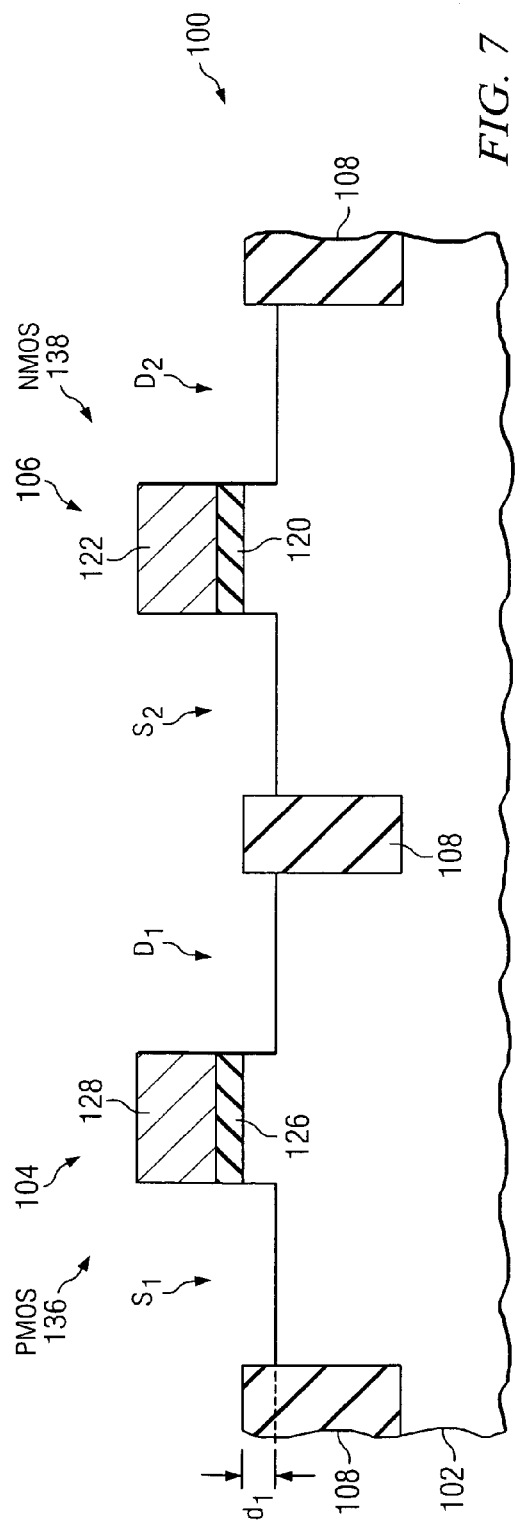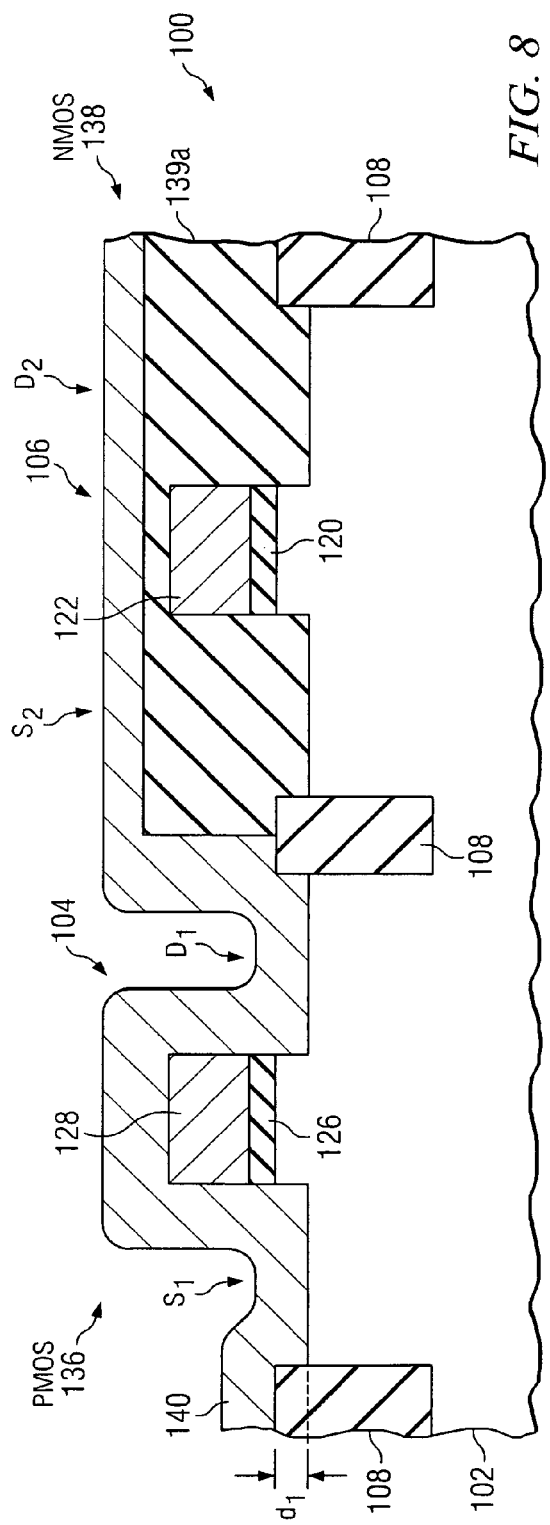

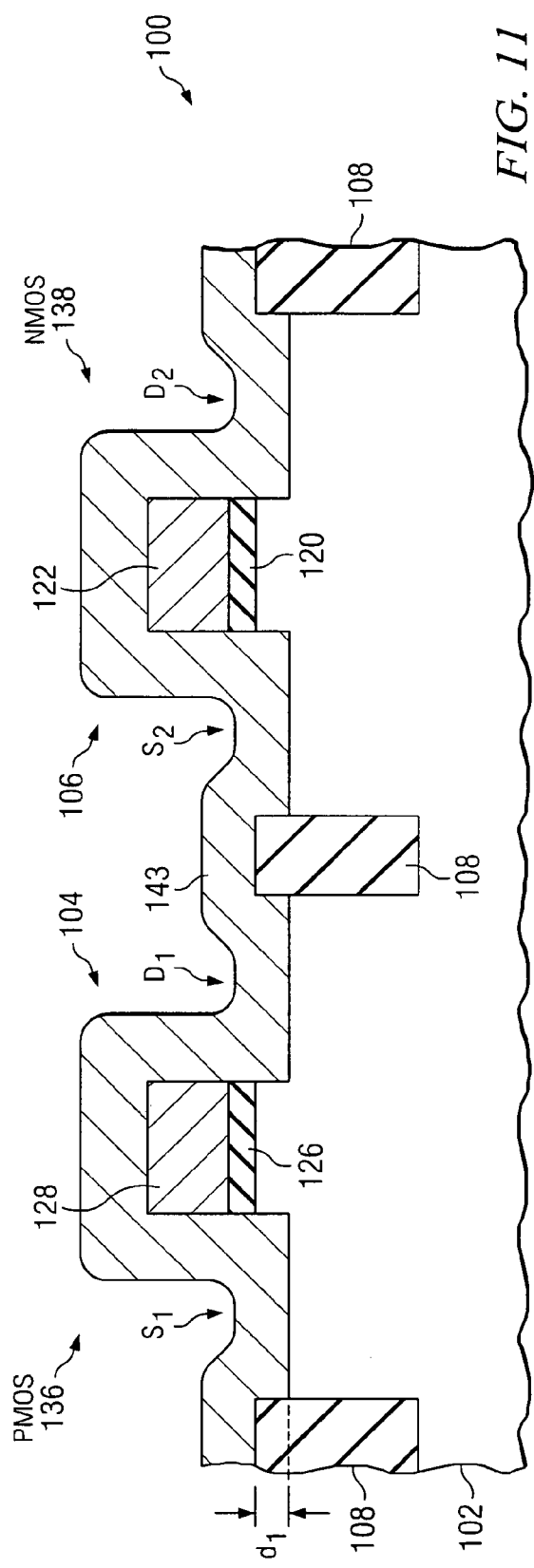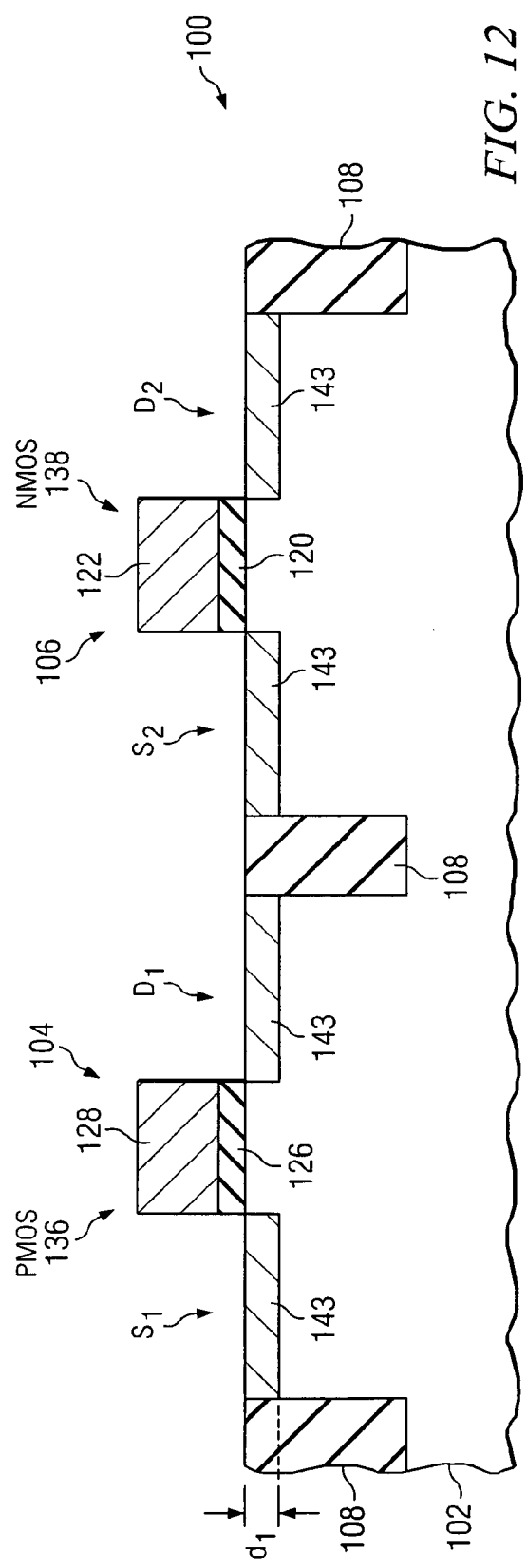

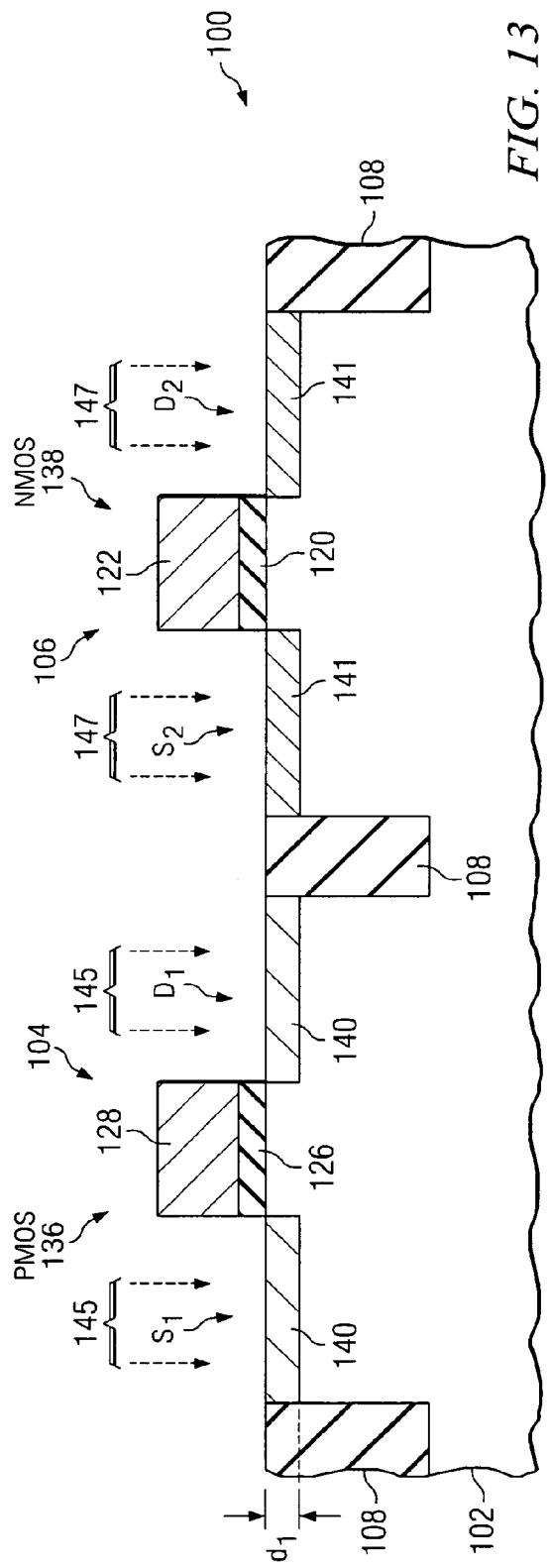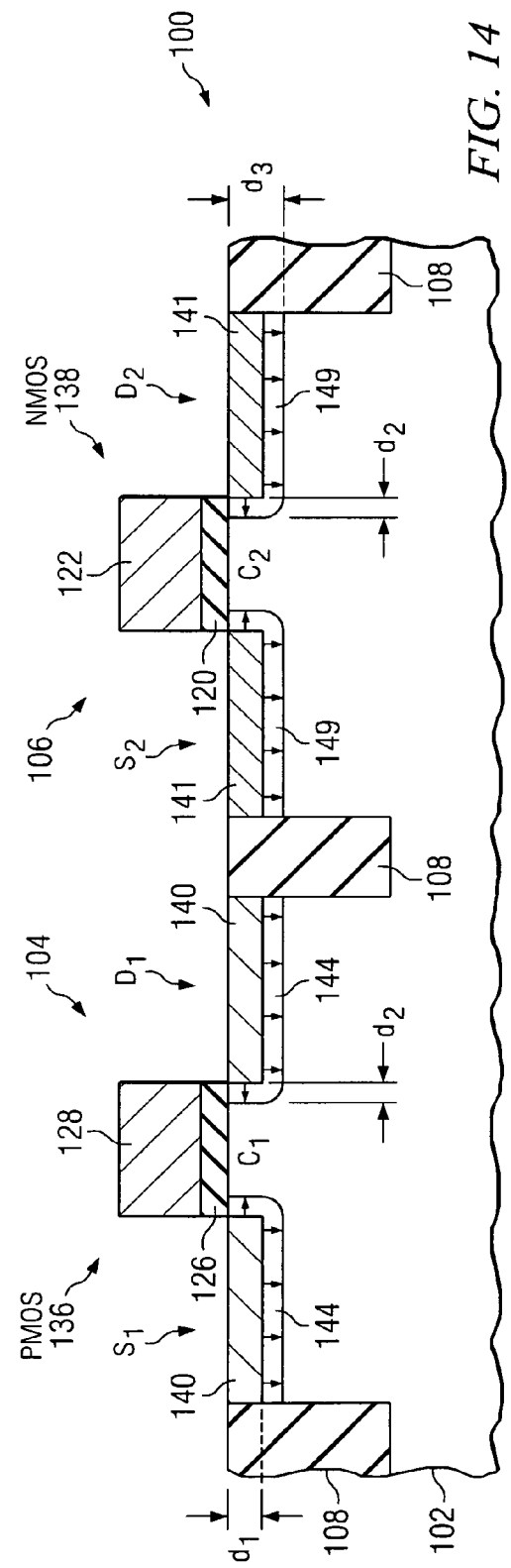

SEMICONDUCTOR DEVICES AND METHODS OF MANUFACTURE THEREOF

CROSS-REFERENCE TO RELATED APPLICATIONS

This application relates to the following co-pending and commonly assigned patent applications: Ser. No. 11/187,197, filed on Jul. 21, 2005, entitled, "CMOS Transistors With Dual High-k Gate Dielectric and Methods of Manufacture Thereof"; Ser. No. 10/870,616, filed on Jun. 17, 2004, entitled, "CMOS Transistor With Dual High-k Gate Dielectric and Method of Manufacture Thereof"; Ser. No. 11/017,062, filed on Dec. 20, 2004, entitled, "Transistor Device and Method of Manufacture Thereof"; and Ser. No. 11/005,292, filed on Dec. 6, 2004, entitled, "CMOS Transistor and Method of Manufacture Thereof," which applications are hereby incorporated herein by reference.

TECHNICAL FIELD

The present invention relates generally to the fabrication of semiconductor devices, and more particularly to transistor devices and the fabrication thereof.

BACKGROUND

Semiconductor devices are used in a variety of electronic applications, such as personal computers, cell phones, digital cameras, and other electronic equipment, as examples. Semiconductor devices are typically fabricated by sequentially depositing insulating (or dielectric) layers, conductive layers and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET).

Early MOSFET processes used one type of doping to create either positive or negative channel transistors. More recent designs, referred to as complementary metal oxide semiconductor (CMOS) devices, use both positive and negative channel devices in complementary configurations. While this requires more manufacturing steps and more transistors, CMOS devices are advantageous because they utilize less power, and the devices may be made smaller and faster.

The gate dielectric for MOSFET devices has in the past typically comprised silicon dioxide, which has a dielectric constant of about 3.9. However, as devices are scaled down in size, using silicon dioxide as a gate dielectric material becomes a problem because of gate leakage current, which can degrade device performance. Therefore, there is a trend in the industry towards the development of the use of high dielectric constant (k) materials for use as the gate dielectric material of MOSFET devices. The term "high k material" as used herein refers to a dielectric material having a dielectric constant of about 4.0 or greater. If high k materials are successfully implemented in transistor designs, the effective oxide thickness of the gate dielectric is expected to be reduced, increasing device performance.

However, using high k dielectric materials as a gate dielectric of transistors can present problems. Some high k dielectric materials have been found to pin the work function of a transistor to undesirable levels. The work function of the transistor affects the threshold voltage. For example, in CMOS devices, it is desirable to achieve a symmetric threshold voltage $V_t$ for the PMOS transistor and the NMOS transistor. If high k dielectric materials are used for the gate dielectric, a symmetric threshold voltage $V_t$ may not be achievable.

U.S. patent application Ser. No. 11/187,197 filed on Jul. 21, 2005, entitled, "CMOS Transistors With Dual High-k Gate Dielectric and Methods of Manufacture Thereof," and U.S. patent application Ser. No. 10/870,616, filed on Jun. 17, 2004, entitled, "CMOS Transistor With Dual High-k Gate Dielectric and Method of Manufacture Thereof," which applications are incorporated herein by reference, disclose CMOS devices having PMOS transistors and NMOS transistors with different high k gate dielectric materials used as a gate dielectric, to avoid problems with the pinning of the work function.

Another problem in the design and manufacture of transistor devices is that in advanced technologies, a reduced junction depth $X_j$ and sheet resistance $R_s$ are required. The thicker the junction depth $X_j$, the more the short channel effects such as hot carrier effects become severe and degrade transistor reliability, causing source and drain leakage and/or punch-through. If a transistor has a high sheet resistance $R_s$, then drive current and circuit speed are degraded, thus making the transistor less reliable for use in high-performance and/or high-speed applications.

U.S. Pat. No. 6,921,691 issued on Jul. 26, 2005 issued to Li, et al., which is hereby incorporated herein by reference, discloses forming recesses in a workpiece and filling the recesses with a dopant-bearing metal. An anneal process is used to form doped regions within the workpiece.

What are needed in the art are CMOS designs and fabrication methods wherein the effective gate dielectric thickness, the junction depth, and the sheet resistance are reduced, and wherein the threshold voltages for the PMOS and NMOS transistors are symmetric.

SUMMARY OF THE INVENTION

These and other problems are generally solved or circumvented, and technical advantages are generally achieved, by preferred embodiments of the present invention which provide novel methods of manufacturing semiconductor devices and structures thereof.

In accordance with a preferred embodiment of the present invention, a workpiece includes a first region and a second region, a first gate dielectric of a first transistor disposed over the workpiece in the first region of the workpiece, and a second gate dielectric of a second transistor disposed over the workpiece in the second region of the workpiece, the second gate dielectric comprising a different material than the first gate dielectric. The workpiece includes recessed regions proximate each of the first gate dielectric and the second gate dielectric. A first dopant-bearing metal is disposed in the recessed regions of the workpiece proximate the first gate dielectric, the first dopant-bearing metal comprising a first dopant. A second dopant-bearing metal is disposed in the recessed regions of the workpiece proximate the second gate dielectric, the second dopant-bearing metal comprising a second dopant, the second dopant being different than the first dopant. A first doped region is disposed in the workpiece adjacent the first dopant-bearing metal, the first doped region comprising the first dopant. A second doped region is disposed in the workpiece adjacent the second dopant-bearing metal, the second doped region comprising the second dopant. The first dopant-bearing metal and the first doped region comprise a source region and a drain region of the first transistor, and the second dopant-bearing metal and the second doped region comprise a source region and a drain region of the second transistor.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1 through 16 show cross-sectional views of a semiconductor device at various stages of manufacturing in accordance with preferred embodiments of the present invention, wherein a first transistor and a second transistor are formed that have different gate dielectric materials, and wherein the source and drain regions of the first and second transistors include a recessed region in the workpiece filled with a dopant-bearing metal;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention achieve technical advantages by providing novel CMOS devices having a different dielectric material for the PMOS transistor than for the NMOS transistor, and having source and drain regions that include a dopant-bearing metal.

The present invention will be described with respect to preferred embodiments in a specific context, namely CMOS devices. The invention may also be applied, however, to other semiconductor devices and applications that require two or more transistors.

FIGS. 1 through 16 show cross-sectional views of a semiconductor device 100 at various stages of manufacturing in accordance with preferred embodiments of the present invention. The semiconductor device 100 comprises a CMOS device comprising dual high k dielectric materials for the gate dielectric; for example, the PMOS transistor preferably has a gate dielectric comprising a high k dielectric material that is different from a high k dielectric material used for the NMOS transistor gate dielectric. The source and drain regions of the CMOS device comprise dopant-bearing metals that are filled in a recess formed in the workpiece, in accordance with preferred embodiments of the present invention. Preferred methods of manufacturing the CMOS device will next be described.

Figure 1:
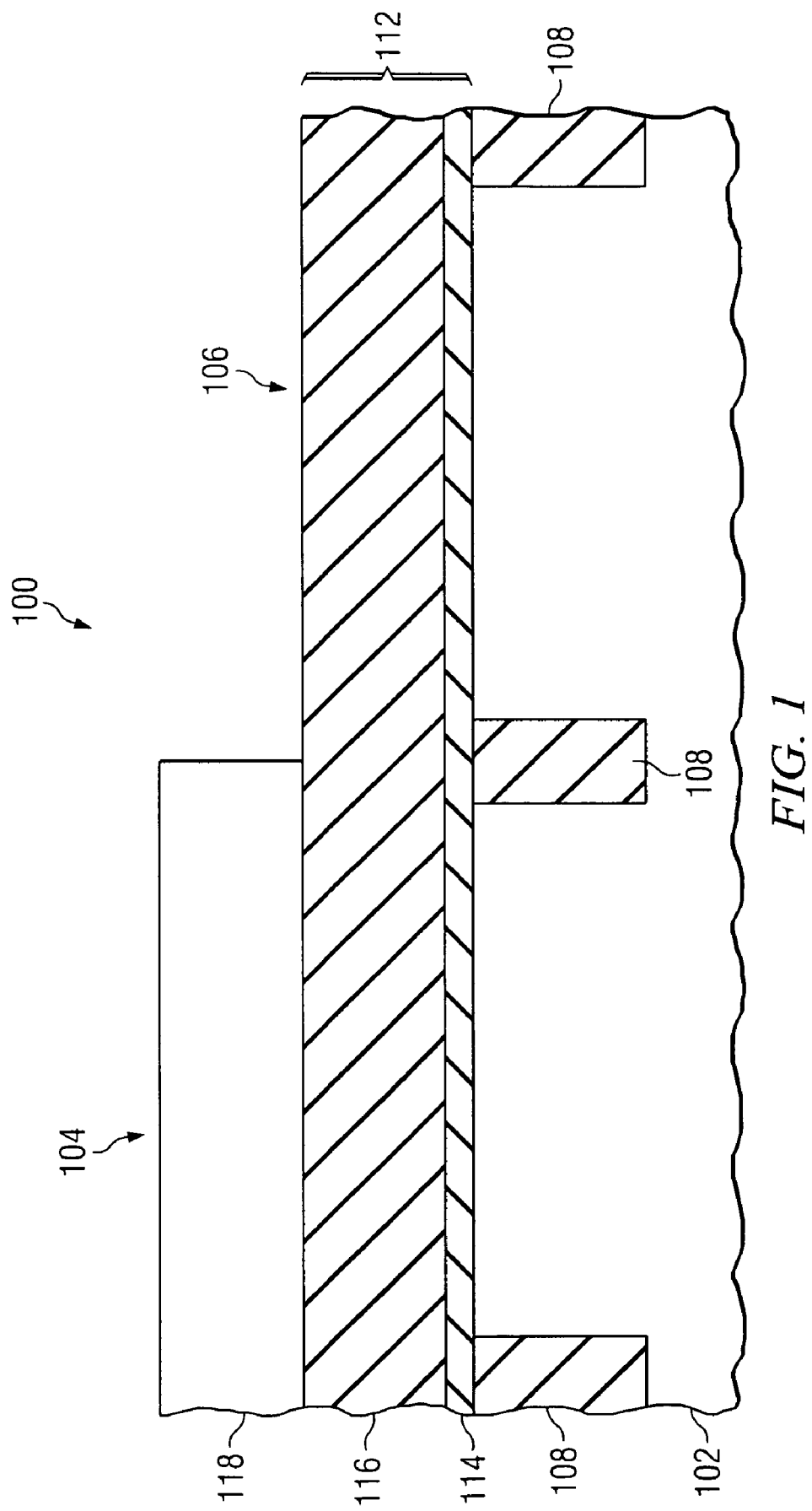

With reference now to FIG. 1, there is shown a semiconductor device 100 in a cross-sectional view including a workpiece 102. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may also comprise bulk Si, SiGe, Ge, SiC, or a silicon-on-insulator (SOI) substrate, as examples.

The workpiece 102 includes a first region 104 and a second region 106. The first region 104 comprises a region where a first transistor comprising a PMOS device or PMOSFET, as examples, will be formed. The second region 106 comprises a region where a second transistor comprising an NMOS device or NMOSFET will be formed, as examples. The PMOS device and NMOS device are not shown in FIG. 1: see FIG. 6 at 136 and 138, respectively.

The first region 104 and the second region 106 may be separated from one another and from adjacent devices or active areas (not shown) by an optional shallow trench isolation (STI) region 108 formed in the workpiece 102, as shown. The first region 104 may be lightly doped with N type dopants, and the second region 106 may be lightly doped with P type dopants, for example. In general, the workpiece 102 is doped with N or P type dopants depending on whether the junctions (e.g., formed by the source and drain regions) of the transistor to be formed will be P or N type, respectively.

The workpiece 102 is preferably cleaned using a pre-gate clean process to remove any contaminant or native oxide from the top surface of the workpiece 102. The pre-gate treatment may comprise an HF, HCl, or ozone based cleaning treatment, as examples, although the pre-gate treatment may alternatively comprise other chemistries.

A hard mask 112 is deposited over the workpiece 102, also shown in FIG. 1. The hard mask 112 preferably comprises a first layer 114 and a second layer 116 disposed over the first layer 114, as shown. Alternatively, the hard mask 112 may comprise a single layer of an oxide or a nitride material, for example. In the embodiment shown in FIG. 1, the first layer 114 of the hard mask 112 preferably comprises about 300 Angstroms (Å) of an oxide material such as tetraethoxysilate (TEOS), although alternatively, the first layer 114 may comprise other insulating materials deposited in other dimensions, for example. The first layer 114 may be deposited by plasma-enhanced chemical vapor deposition (PECVD) or by other deposition techniques, as examples. The second layer 116 preferably comprises about 1,500 Å of a nitride material such as $Si_xN_y$, for example, although alternatively, the second layer 116 may comprise other insulating materials deposited in other dimensions, for example. The second layer 116 may be deposited by PECVD or by other deposition techniques, as examples.

A first layer of photoresist 118 is deposited over the second layer 116 of the hard mask 112, as shown in FIG. 1. The first layer of photoresist 118 may patterned with a mask using traditional lithography techniques to remove the first layer of photoresist 118 from the second region 106 of the workpiece 102, as shown. Alternatively, the first layer of photoresist 118 may be directly patterned using electron beam lithography (EBL) or other direct etching technique, as examples.

The first layer of photoresist 118 is used to pattern at least the second layer 116 of the hard mask 112. For example, exposed portions of the second layer 116 in the second region 106 may be etched using the first layer of photoresist 118 remaining over the first region 104 as a mask. The etch process may be designed to stop when the first layer 114 of the hard mask 112 is reached. The first layer of photoresist 118 is then stripped or removed, and the second layer 116 is then used as a mask to pattern the first layer 114. Alternatively, the first layer of photoresist 118 may be used as a mask to etch both the second layer 116 and the first layer 114 of the hard mask 112, for example. The first layer of photoresist 118 is then stripped or removed.

Figure 2:
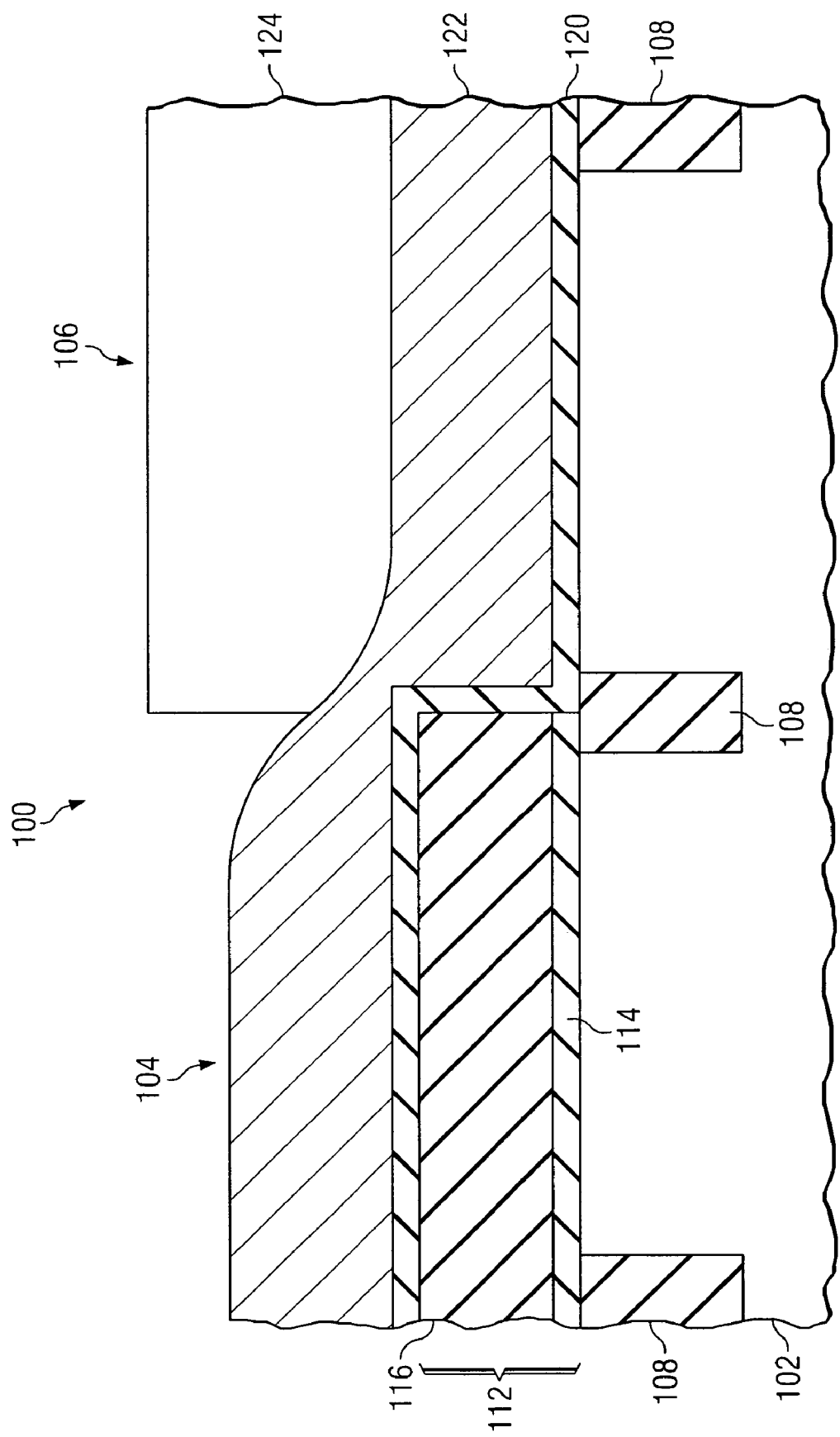

A first gate dielectric material 120 is deposited over the patterned hard mask 112 and exposed portions of the workpiece 102, as shown in FIG. 2. The first gate dielectric material 120 preferably comprises a high-k dielectric material having a dielectric constant of about 4.0 or greater, in one embodiment. The first gate dielectric material 120 preferably comprises $HfO_2$, $HfSiO_x$, $Al_2O_3$, $ZrO_2$, $ZrSiO_x$, $Ta_2O_5$, $La_2O_3$, $SiO_2$, $TiO_2$, $CeO_2$, $Bi_4Si_2O_{12}$, $WO_3$, $Y_2O_3$, $LaAlO_3$, BST ($Ba_{(a-x)}Sr_xTiO_3$), PST ($PbSc_xTa_{(1-a)}O_3$), nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, PZN ($PbZn_xNb_{(1-x)}O_3$), PZT ($PbZr_xTi_{(1-x)}O_3$), PMN ($PbMg_xNb_{(1-x)}O_3$), combinations thereof, or multiple layers thereof, as examples, although alternatively, the first gate dielectric material 120 may comprise other high k insulating materials or other dielectric materials. The first gate dielectric material 120 may comprise a single layer of material, or alternatively, the first gate dielectric material 120 may comprise two or more layers. In one embodiment, one or more of these materials can be included in the first gate dielectric material 120 in different combinations or in stacked layers. The first gate dielectric material 120 may be deposited by chemical vapor deposition (CVD), atomic layer deposition (ALD), metal organic chemical vapor deposition (MOCVD), physical vapor deposition (PVD), or jet vapor deposition (JVD), as examples, although alternatively, the first gate dielectric material 120 may be deposited using other suitable deposition techniques. The first gate dielectric material 120 preferably comprises a thickness of about 10 Å to about 60 Å in one embodiment, although alternatively, the first gate dielectric material 120 may comprise other dimensions, such as about 80 Å or less, as an example.

In some embodiments, the first gate dielectric material 120 preferably comprises a first element comprising Hf, La, Sc, Y, Lu, Lr, Ce, Pr, Nd, Pm, Sm, Eu, Gd, Tb, Dy, Ho, Er, Tm, Zr, or Yb. The first element may comprise an element from Column IIIb of the Periodic Table, or a Lanthanoid from the Periodic Table, as examples. In one embodiment, the first gate dielectric material 120 preferably comprises a La-containing insulating material, for example. The first gate dielectric material 120 preferably comprises a first material such as the first element combined with a second material, such as Hf, Zr, Ta, Ti, Al, or Si, and also combined with either O, N, or both O and N. In another embodiment, the first gate dielectric material 120 preferably comprises a first material comprising a first element, a second material comprising Hf, Zr, Ta, Ti, Al, or Si, and also either O, N, or both O and N, and further comprising a third material, such as Ti, Sr, or Sc. As examples, the first gate dielectric material 120 may comprise LaHfO or LaHfTiO, although alternatively, the first gate dielectric material 120 may comprise other La-containing insulating materials or first element-containing materials.

Advantageously, if the second transistor 138 (see FIG. 6) to be formed in the second region 106 comprises an NMOS transistor, and if the first gate dielectric material 120 comprises La, then the La shifts the flatband voltage $V_{FB}$ of the NMOS transistor 138, allowing tunability of the threshold voltage $V_t$. The other types of first elements of the first gate dielectric material 120 described herein also are preferably adapted to tune the $V_t$ of the NMOS transistor 138, for example.

A first gate material 122 is deposited over the first gate dielectric material 120, also shown in FIG. 2. The first gate material 122 preferably comprises a conductor, such as a metal or polysilicon, although alternatively, other conductive and semiconductive materials may be used for the first gate material 122. For example, the first gate material 122 preferably comprises Au, NiCu, NiTi, PtTa, RuTi, $TaAlN_x$, TaC, TaCN, $MoSi_x$, $IrO_2$, $RuO_2$, $HfSi_x$, $NbSi_x$, $TaSi_x$, TiN, TiCN, HfN, TaN, W, Al, Ru, RuN, RuSiN, RuTa, TaSiN, TiSiN, TaCN, $NiSi_x$, $CoSi_x$, $TiSi_x$, Ir, Y, Pt, Ti, PtTi, Pd, Re, Rh, (borides, phosphides, or antimonides of Ti), Hf, Zr, TiAlN, Mo, MoN, ZrSiN, ZrN, HfN, HfSiN, WN, Ni, Pr, VN, TiW, LaN, LaSiN, WSiN, WSi, polysilicon, a partially silicided material, a fully silicided material (FUSI), other metals, and/or combinations and multiple layers thereof, although alternatively, other materials may also be used. If the gate material 122 comprises FUSI, for example, polysilicon may be deposited over the gate dielectric material 120, and a metal such as nickel may be deposited over the polysilicon, although other metals may be used. The workpiece 102 may then be heated to about 600 or 700 degrees C. to form a single layer of nickel silicide.

The first gate material 122 may comprise a plurality of stacked gate materials, such as a metal underlayer with a polysilicon cap layer disposed over the metal underlayer, or a combination of a plurality of metal layers that form a gate electrode stack. The first gate material 122 may be deposited using CVD, PVD, ALD, or other deposition techniques, as examples. The first gate material 122 preferably comprises a thickness of about 1,500 Å, although alternatively, the first gate material 122 may comprise about 1,000 Å to about 2,000 Å, or other dimensions, for example.

If the first gate material 122 comprises a semiconductive material, preferably, the first gate material 122 is N-doped, by doping the first gate material 122 with N type dopants such as phosphorous or antimony, for example. Doping the first gate material 122 makes the semiconductive material conductive or more conductive. Alternatively, the first gate material 122 may be doped with a P type dopant, for example, as described in Ser. No. 11/017,062, filed on Dec. 20, 2004, entitled, "Transistor Device and Method of Manufacture Thereof," which is incorporated herein by reference.

A second layer of photoresist 124 is deposited over the first gate material 122, as shown in FIG. 2. The second layer of photoresist 124 may patterned using a mask using traditional lithography techniques to remove the second layer of photoresist 124 from over the first region 104 of the workpiece 102, as shown, although alternatively, the second layer of photoresist 124 may be directly patterned.

Figure 3:
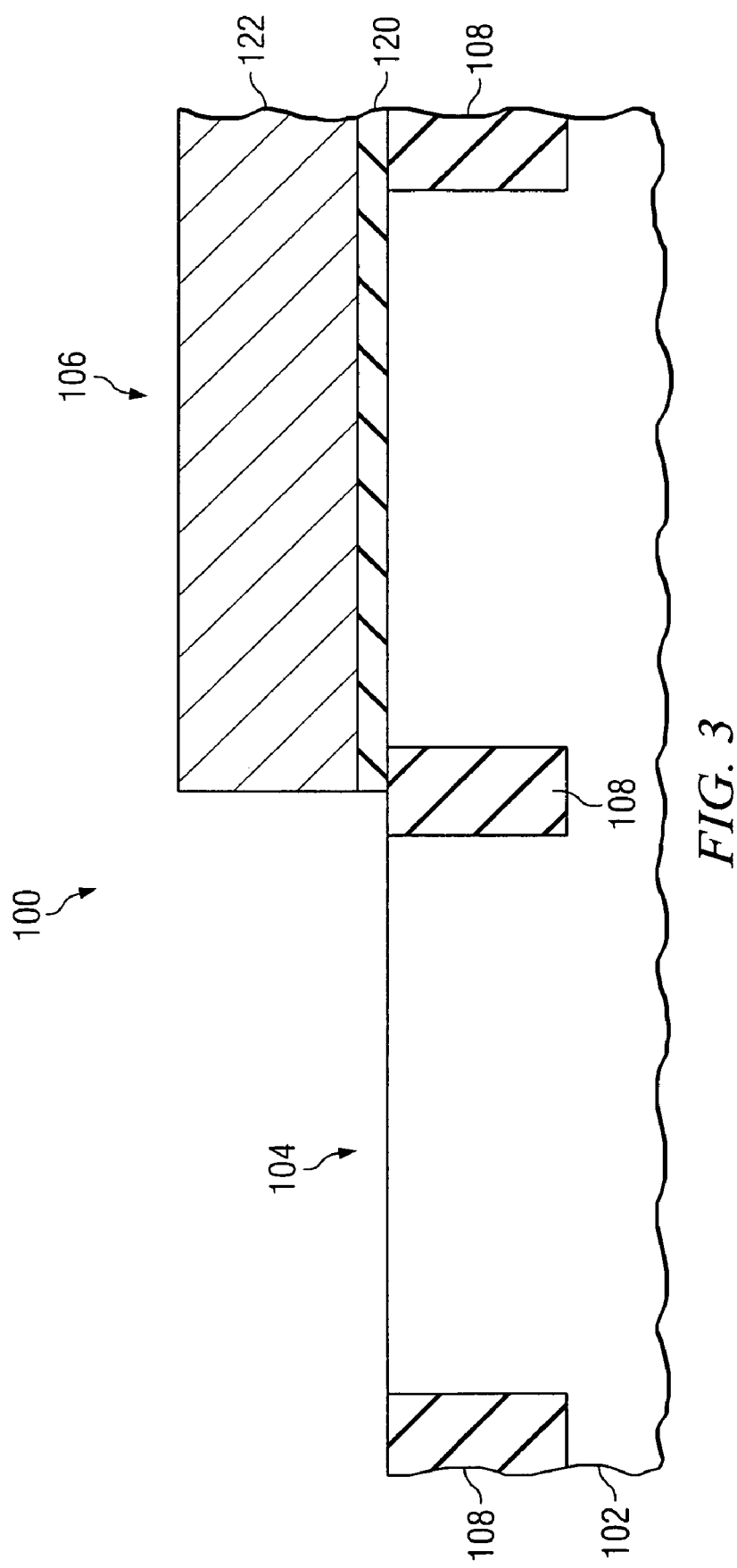

The second layer of photoresist 124 is used as a mask to pattern the first gate material 122 and the first gate dielectric material 120, and to remove the hard mask 112 from the first region 104 of the workpiece 102, as shown in FIG. 3. For example, exposed portions of the first gate material 122, first gate dielectric material 120, and hard mask 112 may be etched away from the first region 104 of the workpiece 102 using the second layer of photoresist 124 as a mask. The second layer of photoresist 124 is then stripped or removed from over the second region 106 of the workpiece 102. Any excess first gate material 122 and first gate dielectric material 120 may be removed from over the optional STI region 108 using a chemical-mechanical polish (CMP) process or an etch process, for example. The exposed surface of the workpiece 102 may be cleaned using a pre-gate clean process.

Figure 4:
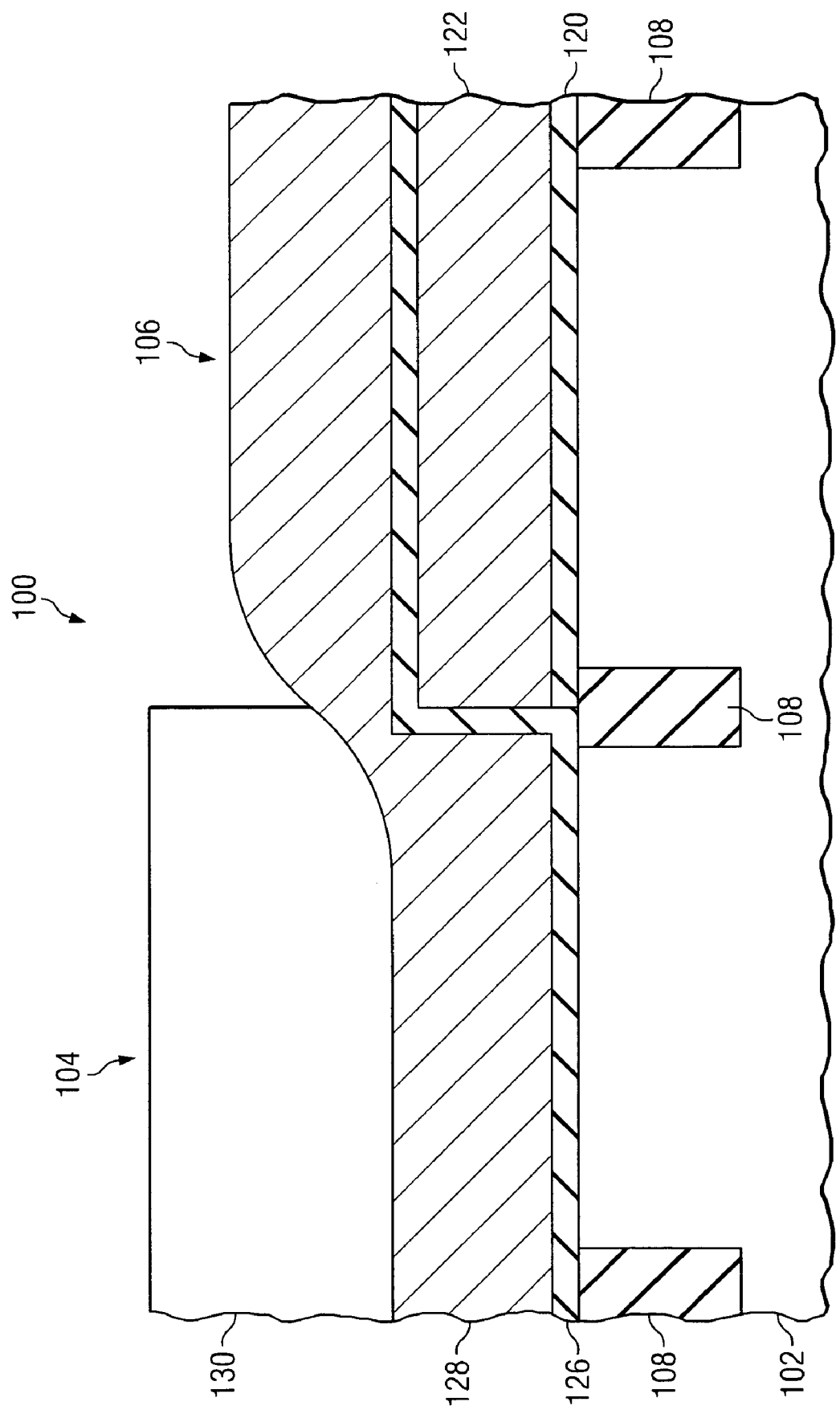

Next, a second gate dielectric material 126 is deposited over exposed portions of the workpiece 102 in the first region 104 and over the patterned first gate material 122 and first gate dielectric material 120 in the second region 106, as shown in FIG. 4. The second gate dielectric material 126 preferably comprises a different material than the first gate dielectric material 120 in accordance with an embodiment of the present invention. The second gate dielectric material 126 preferably comprises a high-k dielectric material having a dielectric constant of about 4.0 or greater, in one embodiment. The second gate dielectric material 126 preferably comprises $HfO_2$, $HfSiO_x$, $Al_2O_3$, $ZrO_2$, $ZrSiO_x$, $Ta_2O_5$, $La_2O_3$, $SiO_2$, $TiO_2$, $CeO_2$, $Bi_4Si_2O_{12}$, $WO_3$, $Y_2O_3$, $LaAlO_3$, BST ($Ba_{(a-x)}Sr_xTiO_3$), PST ($PbSc_xTa_{(1-a)}O_3$), nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, PZN ($PbZn_xNb_{(1-x)}O_3$), PZT ($PbZr_xTi_{(1-x)}O_3$), PMN ($PbMg_xNb_{(1-x)}O_3$), combinations thereof, or multiple layers thereof, as examples, although alternatively, the second gate dielectric material 126 may comprise other high k insulating materials or other dielectric materials.

The second gate dielectric material 126 may comprise a single layer of material, or alternatively, the second gate dielectric material 126 may comprise two or more layers, wherein the top layer comprises a Fermi-pinning material. In one embodiment, one or more of these materials can be included in the second gate dielectric material 126 in different combinations or in stacked layers. The second gate dielectric material 126 may be deposited by CVD, ALD, MOCVD, PVD, or JVD, as examples, although alternatively, the second gate dielectric material 126 may be deposited using other suitable deposition techniques. The second gate dielectric material 126 preferably comprises a thickness of about 10 Å to about 60 Å in one embodiment, although alternatively, the second gate dielectric material 126 may comprise other dimensions, such as about 80 Å or less, as an example. In some embodiments, the second gate dielectric material 126 preferably comprises a Fermi-pinning material such as an aluminum-containing material disposed at the top surface thereof, for example.

In some embodiments, the second gate dielectric material 126 preferably comprises an insulating material comprising a second element, the second element being different than the first element of the first gate dielectric material 120, for example. The second element in these embodiments preferably comprises Al, Y, Sc, Lu, Lr, La, Ce, Pr, Nd, Pm, Sm, Eu, Gd, Tb, Dy, Ho, Er, Tm, Zr, or Yb, as examples. The second element may comprise an element from Column IIIb of the Periodic Table, a Lanthanoid from the Periodic table, Al or an Al-containing material, as examples. In one embodiment, e.g., when the first transistor 136 comprises a PMOS transistor (see FIG. 6) the second gate dielectric material 126 preferably comprises a Y-containing insulating material or an Al-containing insulating material, for example. These materials are particularly beneficial for tuning or shifting the $V_{FB}$ and thus provide tunability of the $V_t$ of the PMOS transistor 136 (shown in FIG. 6), for example. The other types of second elements described herein are also preferably adapted to provide the ability to tune the $V_t$ of the PMOS transistor 136 by varying the amount of the second element in the second gate dielectric material 126, for example.

In some embodiments, the second gate dielectric material 126 preferably comprises a first material such as Y or Al combined with a second material, such as Hf, Zr, Ta, Ti, Al, or Si, and also combined with either O, N, or both O and N, as example, as another example. In another embodiment, the second gate dielectric material 126 preferably comprises a first material comprising Y or Al, a second material comprising Hf, Zr, Ta, Ti, Al, or Si, and also either O, N, or both O and N, and further comprising a third material, such as Ti, Sr, or Sc. As examples, the second gate dielectric material 126 may comprise YHfO, YHfTiO, or AlO, although alternatively, the second gate dielectric material 126 may comprise other materials.

Next, a second gate material 128 is deposited over the second gate dielectric material 126, also shown in FIG. 4. The second gate material 128 preferably comprises a conductor, such as a metal or polysilicon, although alternatively, other conductive and semiconductive materials may be used for the second gate material 128. The second gate material 128 preferably comprises Au, NiCu, NiTi, PtTa, RuTi, $TaAlN_x$, TaC, TaCN, $MoSi_x$, $IrO_2$, $RuO_2$, $HfSi_x$, $NbSi_x$, $TaSi_x$, TiN, TiCN, HfN, TaN, W, Al, Ru, RuN, RuSiN, RuTa, TaSiN, TiSiN, TaCN, $NiSi_x$, $CoSi_x$, $TiSi_x$, Ir, Y, Pt, Ti, PtTi, Pd, Re, Rh, (borides, phosphides, or antimonides of Ti), Hf, Zr, TiAlN, Mo, MoN, ZrSiN, ZrN, HfN, HfSiN, WN, Ni, Pr, VN, TiW, LaN, LaSiN, WSiN, WSi, polysilicon, a partially silicided material, a fully silicided material (FUSI), other metals, and/or combinations and multiple layers thereof, although other materials may also be used. The second gate material 128 may comprise a plurality of stacked gate materials, such as a metal underlayer with a polysilicon cap layer disposed over the metal underlayer, or a combination of a plurality of metal layers that form a gate electrode stack. The second gate material 128 may be deposited using CVD, PVD, ALD, or other deposition techniques, as examples. The second gate material 128 preferably comprises a thickness of about 1,500 Å, although alternatively, the second gate material 128 may comprise about 1,000 Å to about 2,000 Å, or other dimensions, for example. The second gate material 128 may comprise the same material as the first gate material 122, or alternatively, the second gate material 128 may comprise a different material than the first gate material 122, for example.

If the second gate material 128 comprises a semiconductive material, then preferably, the second gate material 128 is P-doped, by doping the second material 128 with a P type dopant such as boron, as an example. Doping the second gate material 128 makes the semiconductive material conductive or more conductive. In one embodiment, the second gate material 128 is preferably doped with an N type dopant, for example. The second gate material 128 may be doped with the same dopant type or a different dopant type than the first gate material 122 is doped with, for example.

A third layer of photoresist 130 is deposited over the second gate material 128, as shown in FIG. 4. The third layer of photoresist 130 may be patterned using a mask by traditional lithography techniques to remove the third layer of photoresist 130 from the second region 106 of the workpiece 102, as shown, although alternatively, the third layer of photoresist 130 may be directly patterned.

Figure 5:
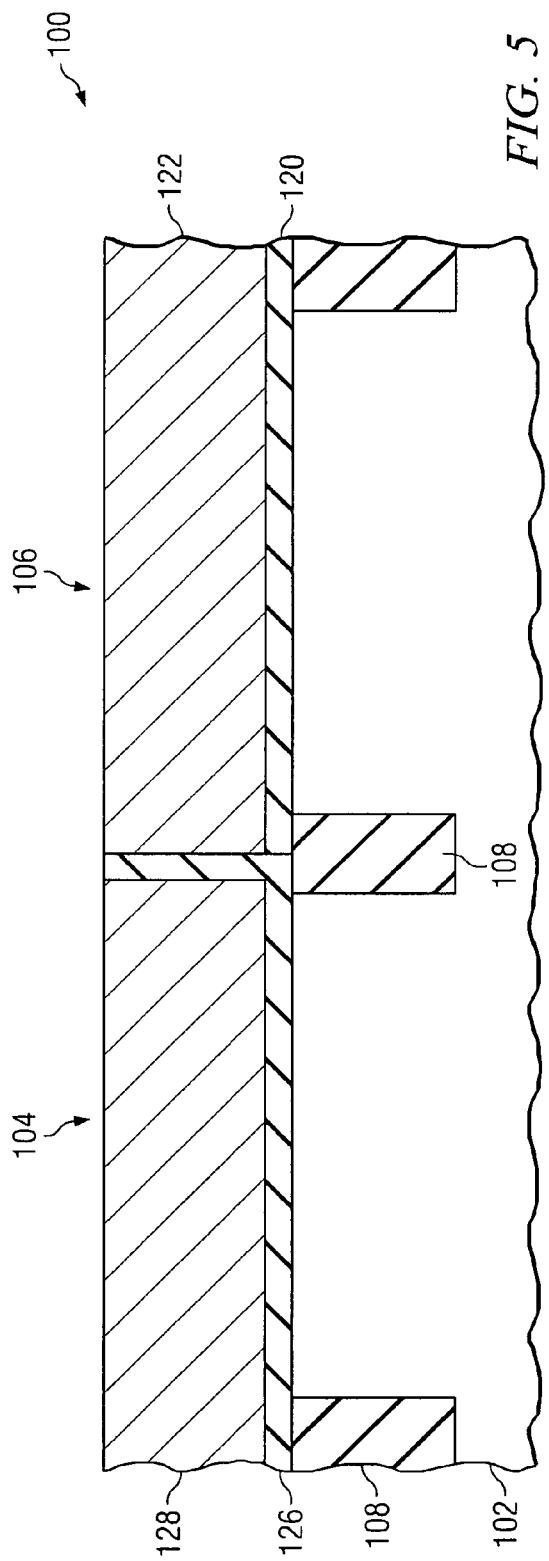

The third layer of photoresist 130 is then used as a mask to pattern the second gate material 128 and second gate dielectric material 126, as shown in FIG. 5. For example, exposed portions of the second gate material 128 and second gate dielectric material 126 may be etched away from the second region 106 of the workpiece 102 using the third layer of photoresist 130 as a mask. The third layer of photoresist 130 is then stripped or removed from over the first region 104 of the workpiece 102.

Any excess second gate material 128 and second gate dielectric material 126 may be removed from over the optional STI region 108 proximate the interface of the first region 104 and second region 106 using a chemical-mechanical polish (CMP) process or an etch process, for example (not shown), leaving the structure shown in FIG. 5.

Figure 6:
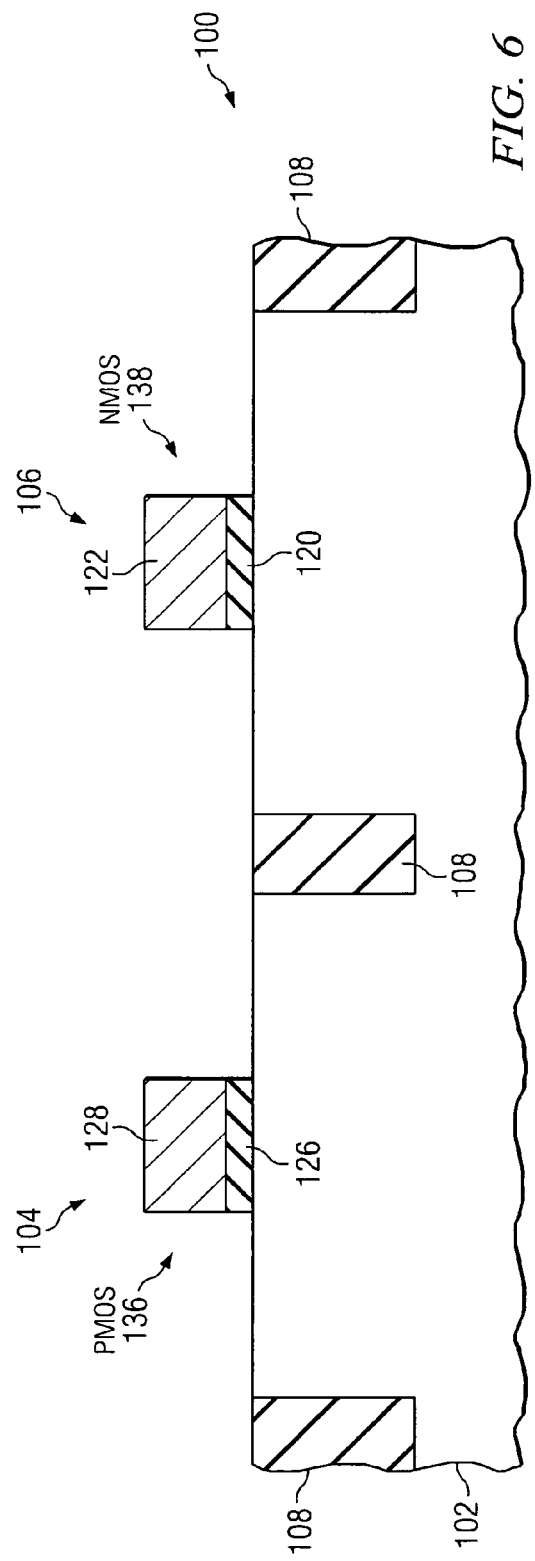

Preferably using a single lithography step, e.g., using a single layer of photoresist and using a single mask to pattern the photoresist, the first gate material 120, the first gate dielectric material 122, the second gate material 126, and the second gate dielectric material 128 are simultaneously patterned with a desired pattern for a CMOS device, leaving the structure shown in FIG. 6, wherein a PMOS transistor 136 is formed in the first region 104, and an NMOS transistor 138 is formed in the second region 106. The gate dielectric of the PMOS transistor 136 comprises the second gate dielectric material 126, and the gate dielectric of the NMOS transistor 138 comprises the first gate dielectric material 120. The gate or gate electrode of the PMOS transistor 136 comprises the second gate material 128, and the gate of the NMOS transistor 138 comprises the first gate material 122. The gate dielectric 126 of the PMOS transistor 136 preferably comprises an insulating material that is different than the insulating material of the gate dielectric 120 of the NMOS transistor 138.

Other methods may be used to form the PMOS transistor 136 and NMOS transistor 138 having different gate dielectrics 126 and 120. For example, some alternative methods that may be used to form the different gate dielectrics 126 and 120 are described in U.S. patent application Ser. No. 10/870,616, filed on Jun. 17, 2004, entitled, "CMOS Transistor With Dual High-k Gate Dielectric and Method of Manufacture Thereof," which is incorporated herein by reference. For example, a first insulating layer may be deposited over the entire workpiece, (not shown in the drawings), and the first insulating layer may be removed in one region, such as first region 104, but not the other region, such as second region 106. A second insulating layer may then be deposited over the first insulating layer in the second region 106 and over the workpiece 102 in the first region 104. Then a single layer of gate material is formed over the second insulating layer. The gate material and insulating layers are then patterned to form a PMOS transistor having a gate dielectric comprising the second insulating layer, and an NMOS transistor having a gate dielectric comprising both the first and second insulating layers.

Alternatively, a single layer of insulating material may be deposited over the workpiece 102, and a gate material comprising a conductive material, for example, may be deposited over the insulating material (also not shown). One region, such as the first region 104, may be masked, while the other region, such as second region 106, is implanted with a Fermi-pinning material. For example, at least the gate material may be implanted with the Fermi-pinning material. In some embodiments, the insulating material is also implanted with the Fermi-pinning material, for example. The gate material of the PMOS transistor may be implanted with a different material than the gate material of the NMOS transistor is implanted with, for example.

Next, in accordance with a preferred embodiment of the present invention, the workpiece 102 is recessed in the source and drain regions, as shown in FIG. 7. The source regions and drain regions (e.g., source region $S_1$ and drain region $D_1$ of the PMOS transistor 136, and source region $S_2$ and drain region $D_2$ of the NMOS transistor 138) may be recessed using a dry etch process containing argon as an example, although alternatively, other etch chemistries may also be used to form the recesses. The etch process in one embodiment is preferably substantially anisotropic, to avoid reducing the horizontal dimensions (e.g., lateral etching) of the gates 128 and 122 and the gate dielectric 126 and 120, for example. Alternatively, the etch process to create the recesses may comprise an isotropic etch, such as an etch process referred to as "chemical downstream etching," which is a technique employing microwave plasma source, low bias RF power, or a combination of both, for isotropic recessing of silicon in the workpiece 102 selective to the isolation oxide 108, as an example, although other isotropic etch processes may alternatively be used. The depth $d_1$ of the recesses in the source $S_1/S_2$ and drain $D_1/D_2$ regions preferably comprises about 200 Å or less below the top surface of the workpiece 102, as an example. Preferably, the source $S_1/S_2$ regions and the drain $D_1/D_2$ regions are recessed simultaneously in a single processing step, e.g., they are recessed at the same time. The source $S_1/S_2$ regions and drain $D_1/D_2$ regions may be recessed using an additional separate etch process, or alternatively, the source $S_1/S_2$ regions and the drain $D_1/D_2$ regions may be recessed during the gate 128/122 and gate dielectric 126/120 patterning process, for example.

Two recesses are preferably formed for each transistor 136 and 138, as shown. For example, for the PMOS transistor 136, a first recess is formed in the workpiece 102 on a first side of the gate dielectric 126 proximate the gate dielectric 126, and a second recess is formed in the workpiece 102 on a second side of the gate dielectric 126 proximate the gate dielectric 126, for example, opposite from the first side of the gate dielectric 126. Likewise, for the NMOS transistor 138, a third recess is formed in the workpiece 102 on a first side of the gate dielectric 120 proximate the gate dielectric 120, and a fourth recess is formed in the workpiece 102 on a second side of the gate dielectric 120 proximate the gate dielectric 120, for example, opposite from the first side of the gate dielectric 120, as shown.

Figure 9:
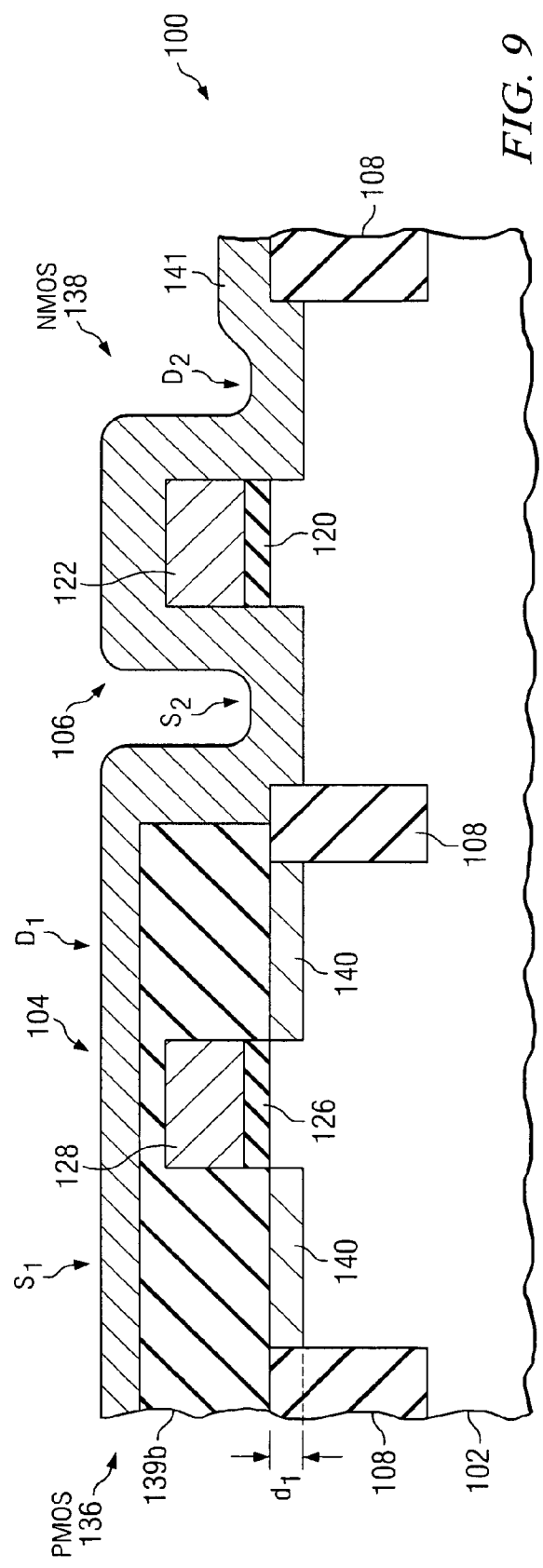

In some embodiments, the recesses in the workpiece 102 of the PMOS transistor 136 are filled with a first dopant-bearing metal while the NMOS transistor 138 is masked, and then the recesses in the workpiece 102 of the NMOS transistor 138 are filled with a second dopant bearing metal, to be described next with reference to FIGS. 8 through 10. For example, a masking material 139a that may comprise a hard mask including about 5,000 Å of an oxide, a nitride, or combinations thereof, as examples, is deposited over the first region 104 and the second region 106 of the workpiece 102, and then the masking material 139a is removed from over the first region 104, e.g., using lithography, as shown in FIG. 8. A first dopant-bearing metal 140 is deposited over exposed portions of the workpiece 102, the top surface of the gate 128, and isolation regions 108, in the first region 104, and over the masking material 139a in the second region 106, as shown in FIG. 8.

The first dopant-bearing metal 140 preferably comprises a metal that includes a first dopant comprising boron (B), phosphorous (P), arsenic (As), or antimony (Sb), as examples, although alternatively, the dopant may comprise other dopant materials. If the transistor 136 in the first region 104 comprises a PMOS transistor, for example, preferably the workpiece 102 is lightly doped with an N type material in the first region 104, and the first dopant preferably comprises a P type material, for example.

The first dopant-bearing metal 140 preferably comprises $TiB_2$, $ZrB_2$, $HfB_2$, ZrP, TiP, $ZrSb_2$, $TiSb_2$, $HfSb_2$, or arsinides of Zr or Hf, as examples, although alternatively, the dopant-bearing metal 140 may comprise other metals containing a first dopant. In some embodiments, for example, the first dopant-bearing metal 140 preferably comprises Au, NiCu, NiTi, PtTa, RuTi, $TaAlN_x$, TaC, TaCN, $MoSi_x$, $IrO_2$, $RuO_2$, $HfSi_x$, $NbSi_x$, $TaSi_x$, TiN, TiCN, HfN, TaN, W, Al, Ru, RuN, RuSiN, RuTa, TaSiN, TiSiN, TaCN, $NiSi_x$, $CoSi_x$, $TiSi_x$, Ir, Y, Pt, Ti, PtTi, Pd, Re, Rh, (borides, phosphides, or antimonides of Ti), Hf, Zr, TiAlN, Mo, MoN, ZrSiN, ZrN, HfN, HfSiN, WN, Ni, Pr, VN, TiW, LaN, LaSiN, WSiN, $WSi_x$, a partially silicided material, a fully silicided material (FUSI), other metals, and/or combinations and multiple layers thereof. The first dopant-bearing metal 140 preferably comprises a thickness greater than the depth $d_1$ of the recesses, for example.

The metal portion (e.g., Ti, Zr, Hf, or other materials listed) of the first dopant-bearing metal 140 causes the source $S_1$ and drain $D_1$ regions to have a lower sheet resistance $R_s$, and the first dopant portion (e.g., B, P, Sb, As) creates the junction of the source $S_1$ and drain $D_1$. Preferably, in accordance with embodiments of the present invention, the first dopant-bearing metal 140 is selected to provide a reduced sheet resistance $R_s$ for the semiconductor device 100.

The recesses in the source $S_1$ and drain $D_1$ regions are preferably back-filled with the first dopant-bearing metal 140. For example, the first dopant-bearing metal 140 may be deposited using electron beam evaporation, CVD, or PVD, although alternatively, other methods of deposition may be used to deposit the first dopant-bearing metal 140.

The first dopant-bearing metal 140 may be substantially conformal when deposited, as shown in FIG. 8. Excess portions of the first dopant-bearing metal 140 are removed from over the isolation regions 108, top surface and sidewalls of the gates 128, and sidewalls of the gate dielectric 126, as shown in FIG. 9. The excess portions of the first dopant-bearing metal 140 may be removed using an anisotropic etch process or an isotropic etch process, as examples. As examples, the excess portions of the first dopant-bearing metal 140 may be removed using wet, dry, electrochemical or chemical etch processes, although other etch processes may alternatively be used. The top surface of the first dopant-bearing metal regions 140 formed in the source $S_1$ and drain $D_1$ regions may be substantially planar with the top surface of the workpiece 102, as shown in FIG. 9, although alternatively, the first dopant-bearing metal regions 140 may be slightly recessed or concaved slightly within the recesses of the workpiece 102 (not shown). The masking material 139a is removed from the second region 106 of the workpiece 102.

A second masking material 139b comprising similar materials and thicknesses as described for the masking material 139a is formed or deposited over the first region 104 and the second region 106 of the workpiece 102. The masking material 139b is removed from over the second region 106, as shown in FIG. 9, leaving the gate material 122 and portions of the workpiece 102 exposed. A second dopant-bearing metal 141 is deposited over the exposed portions of the workpiece 102, top surface and sidewalls of the gate material 122, and sidewalls of the gate dielectric 120 in the second region 106, and also over the masking material 139b in the first region, as shown in FIG. 9.

The second dopant-bearing metal 141 preferably comprises similar materials and dimensions as described for the first dopant-bearing metal 140, for example. The second dopant-bearing metal 141 preferably comprises a different material than the first dopant-bearing metal 140, for example. The second dopant-bearing metal 141 preferably comprises a second dopant, wherein the second dopant is different than the first dopant of the first dopant-bearing metal 140, for example. In some embodiments, if the transistor 138 in the second region 106 comprises an NMOS transistor, then the workpiece 102 is preferably lightly doped with a P type dopant in the second region 106, and the second dopant-bearing metal 141 preferably comprises an N type material, for example.

Figure 10:
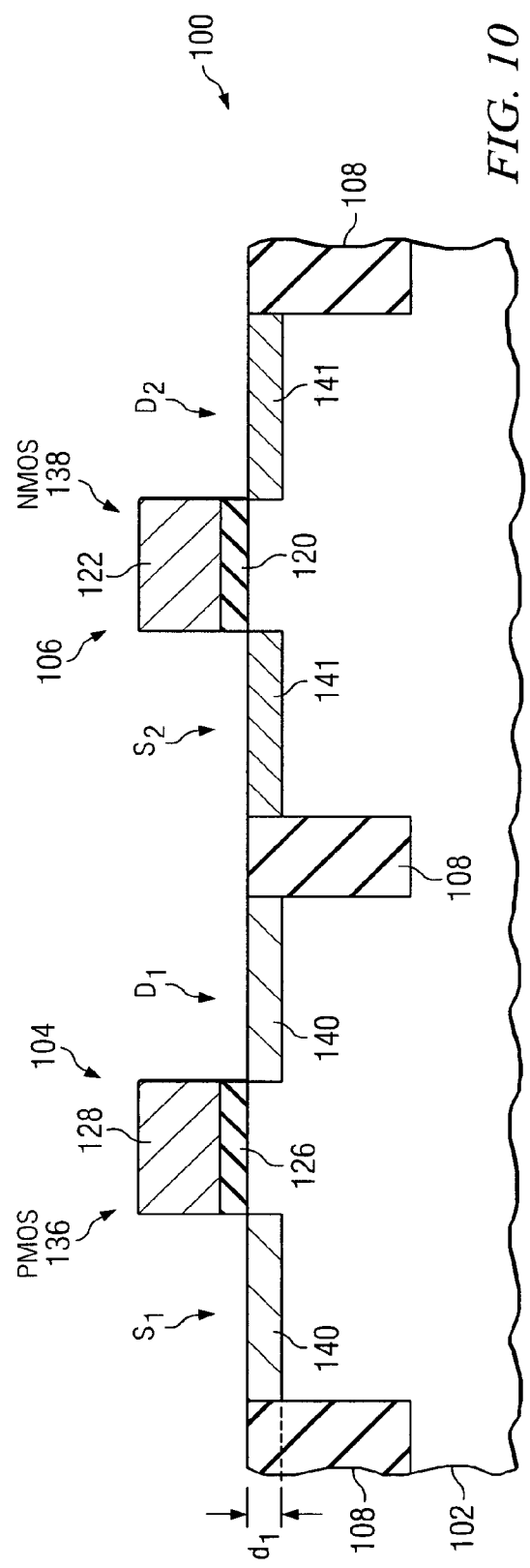

Excess portions of the second dopant-bearing metal 141 are removed from over the isolation regions 108 in the second region 106, top surface and sidewalls of the gates 122, and sidewalls of the gate dielectric 120, using the methods described for the first dopant-bearing metal 140, and leaving the structure shown in FIG. 10, wherein the first dopant-bearing metal 140 fills the recesses in the workpiece 102 in the first region 104, and wherein the second dopant-bearing metal 141 fills the recesses in the workpiece 102 in the second region 106. The top surface of the second dopant-bearing metal regions 141 formed in the source $S_2$ and drain $D_2$ regions may be substantially planar with the top surface of the workpiece 102, as shown in FIG. 10, although alternatively, the second dopant-bearing metal regions 141 may be slightly recessed or concaved slightly within the recesses of the workpiece 102 (not shown). The masking material 139b shown in FIG. 9 is removed from the first region 106 of the workpiece 102, as shown in FIG. 10.

In another embodiment, to fill the recesses in the workpiece with a dopant-bearing metal, a single metal layer 143 is deposited over the first region 104 and the second region 106 of the workpiece 102, as shown in FIG. 11. The metal layer 143 may be masked in the second region 106 while a first dopant is implanted into the metal layer 143 in the first region 104, and the metal layer 143 may be masked in the first region 104 while a second dopant is implanted into the metal layer 143 in the second region 106. Excess portions of the metal layer 143 are then removed from above a top surface of the workpiece 102, leaving the structure shown in FIG. 13, wherein the metal layer 143 implanted with the first dopant comprises a first dopant-bearing metal 140 in the first region 104 and the metal layer 143 implanted with the second dopant comprises a second dopant-bearing metal 141 in the second region 106. Advantageously, the gates 128 and 122 are not implanted with the first dopant and second dopant, respectively, in this embodiment, so that the gate 128 may be doped with a different type dopant than the first dopant-bearing metal 140, and the gate 122 may be doped with a different type dopant than the second dopant-bearing metal 141, for example.

In another embodiment, before the single metal layer 143 is implanted with the first dopant and the second dopant, excess portions of the metal layer 143 are removed from above the top surface of the workpiece 102, leaving the structure shown in FIG. 12. The metal layer 143 is masked in the second region 106 while a first dopant 145 is implanted into the metal layer 143 in the first region 104, forming a first dopant-bearing metal 140 as shown in FIG. 13. The gate 128 in the first region 104 is also implanted with the first dopant 145 in this embodiment. The metal layer 143 may be masked in the first region 104 while a second dopant 147 is implanted into the metal layer 143 in the second region 106, forming a second dopant-bearing metal 141 as shown in FIG. 13. The gate 122 in the second region 106 is also implanted with the second dopant 147 in this embodiment.

In one embodiment, the first and second dopant-bearing metal regions 140 and 141 may be doped using an additional ion implantation step (e.g., masking one region 104 while implanting the other region 106), not shown. This is an optional step that is not required in embodiments of the present invention but may be appropriate for some transistor designs. In this optional step, dopant ions are introduced into the dopant-bearing metal regions 140 and 141 using ion implantation. This increases the dopant concentration in the dopant-bearing metal regions 140 and 141, resulting in an increase in dopant concentration of the underlying dopant region during the diffusion of the dopant of the dopant-bearing metal regions 140 and 141 into the underlying substrate 102 in subsequent processing steps. When this optional ion implantation step is included in the manufacturing process, preferably, the implantation is performed at an energy level of about 1 KeV or below at an implantation dose of about $1 \times 10^{15}$ ions/cm$^2$ or less, as examples.

The workpiece 102 is then subjected to a low-temperature anneal process to cause out-diffusion of the first and second dopants in the dopant-bearing metal regions 140 and 141, respectively. The out-diffusion of the first dopant in the first region 104 forms a doped region 144 comprising the first dopant in the source $S_1$ region and drain $D_1$ region within the workpiece 102 adjacent the dopant-bearing metal regions 140, as shown in FIG. 14. The anneal process also causes out-diffusion of the second dopant in the second region 106, forming a doped region 149 comprising the second dopant in the source $S_2$ region and drain $D_2$ region within the workpiece 102 adjacent the dopant-bearing metal regions 141. The doped regions 144 and 149 preferably extend beneath the dopant-bearing metal regions 140 and 141, and also extend laterally (to the side of the dopant-bearing metal regions 140 and 141) beneath the gates 128/122 and gate dielectric 126/120 by about 70 Å or less, as shown at $d_2$. The low-temperature anneal process preferably comprises a temperature of about 900° C. or less for about 1 hour or less, and more preferably comprises a temperature of about 900° C. for about 20 minutes or less, as examples. The doped regions 144 preferably comprise a thickness of about 100 Å or less, as an example.

Thus, the source $S_1/S_2$ and the drain $D_1/D_2$ regions each comprise a dopant-bearing metal 140/141 and a doped region 144/149 disposed adjacent (e.g., below and extending laterally from) the dopant-bearing metal 140/141, as shown. The source $S_1/S_2$ and drain $D_1/D_2$ regions preferably comprise a total thickness $d_3$ of about 300 Å below the top surface of the workpiece 102, comprising the dopant-bearing metal 140/141 and the doped regions 144/149.

Note that the doped regions 144/149 include an extension region that extends beneath the gate dielectric 126/120 and extends towards the channel regions $C_1$ and $C_2$. One advantage of the transistors 136 and 138 formed in accordance with embodiments of the present invention is that the extension region can be made smaller than in traditional transistor designs. For example, the extension region may extend beneath the gates 128/122 on either side by a distance $d_2$, which may comprise about 70 Å or less, e.g., about 20 to about 50 Å. This is advantageous because the resistance of the extension region is low, resulting from the reduced amount of overlap $d_2$, which reduces hot carrier effects of the transistors 136 and 138.

In one embodiment, the dopant-bearing metal 140/141 preferably comprises a higher atomic percentage of the dopant than would be found in a natural state of the dopant-bearing metal 140/141, and the percentage of the dopant in the dopant-bearing metal 140/141 is reduced after the low-temperature anneal, resulting from dopant ions diffusing into the workpiece 102 to form the doped regions 144/149. For example, if the dopant-bearing metal 140 in the first region 104 comprises Ti bearing the dopant B, the dopant-bearing metal 140 may comprise TiB$_x$, where x>2, e.g., 3, 4, etc. In this embodiment, after the low temperature anneal to form the doped regions 144, the dopant-bearing metal 140 comprises a reduced atomic percentage of the first dopant, and may comprise, for example, TiB$_2$. Note that while there is less of the dopant species (e.g., the first dopant) left residing in the dopant-bearing metal 140 after the low-temperature anneal because some dopant atoms migrate to the dopant region 144, some dopant species are still left residing in the dopant-bearing metal 140.

Figure 15:
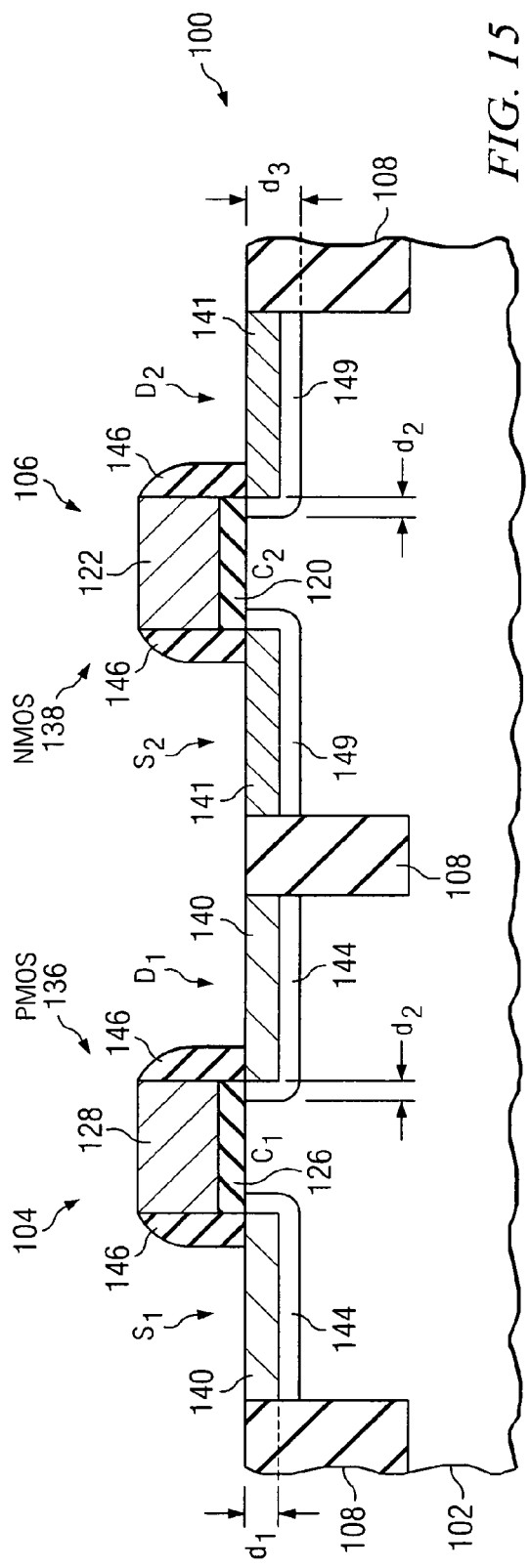

The manufacturing process for the device 100 is then continued to complete the device 100, preferably without subjecting the semiconductor device 100 to high temperatures, e.g., preferably without exposing the semiconductor device 100 to a temperature greater than about 900° C. For example, a spacer material 146 comprising a dielectric material such as SiO$_2$, SiN, or SiON, as examples, although other insulating materials may also be used, may be deposited over exposed portions of the workpiece 102. The sidewall spacer 146 material may be exposed to an etch process such as an anisotropic etch to form sidewall spacers 146 on the transistors 136 and 138 in the first and second regions 104 and 106 of the workpiece 102, as shown in FIG. 15.

Thus, in accordance with an embodiment of the invention, transistors 136 and 138 are formed that include gates 128/122, source regions $S_1/S_2$, and drain regions $D_1/D_2$, wherein the source $S_1/S_2$ and drain $D_1/D_2$ comprise the dopant-bearing metal regions 140/141 and the doped regions 144/149. The transistors 136 and 138 have a thin effective oxide thickness which includes the gate dielectric 126/120 and in some embodiments also includes a thin interface region disposed between the workpiece 102 and the gate dielectric 126/120 (not shown). The thin interface region may form during the deposition process of the gate dielectric materials 126 and 120, for example, and may comprise a thin oxide layer, for example. Advantageously, because the transistors 136 and 138 are not exposed to a high-temperature anneal process, e.g., at temperatures of about 1,000° C. or more, increasing the thickness of the interface region, if present, is avoided, thus decreasing the effective oxide thickness of the transistors 136 and 138.

Furthermore, because a low-temperature anneal process is preferably used to form the doped regions 144/149 of the source $S_1/S_2$ and drain $D_1/D_2$ regions, this results in a shallower junction depth (e.g., depth $d_3$ of the source and drain regions $S_1/S_2$ and $D_1/D_2$) of the transistors 136 and 138.

The transistors 136 and 138 are particularly advantageous in applications wherein a high drive current and minimal effective oxide thickness are important, such as in high performance (e.g., high speed) applications, for example, in use with memory and other devices.

Figure 16:
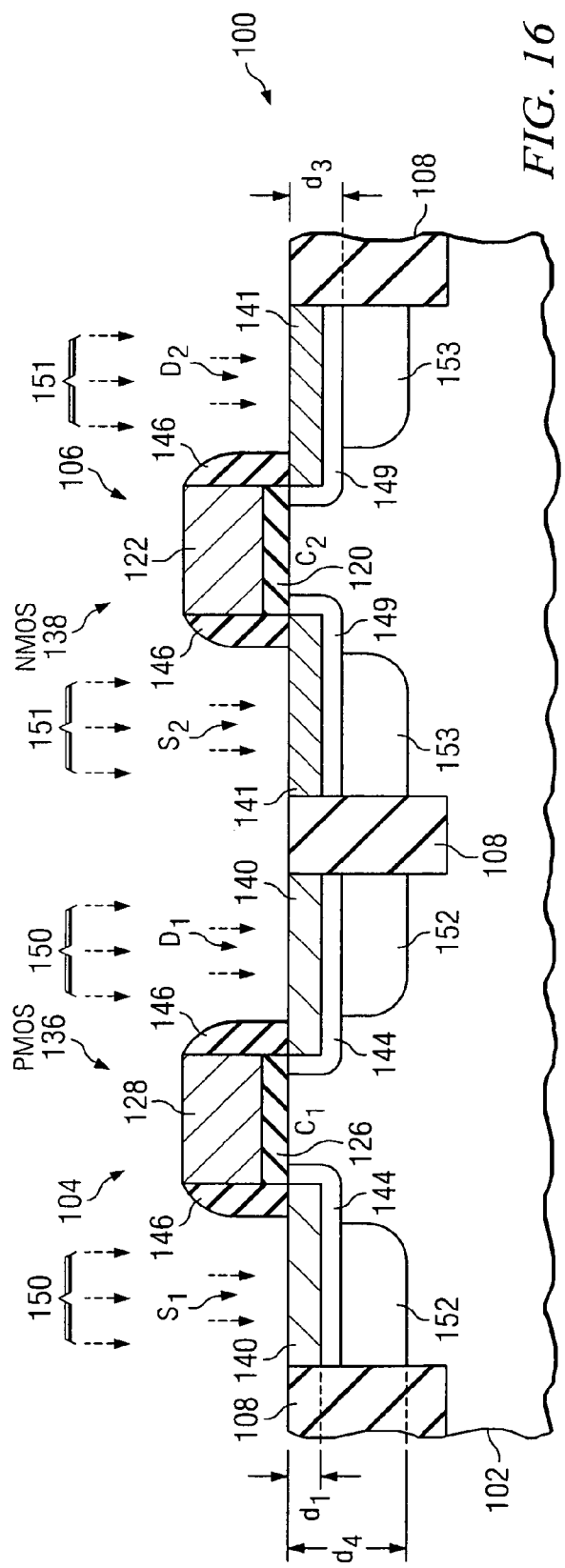

FIG. 16 shows an embodiment of the present invention, in which a similar process flow may be used as was described for FIGS. 1 through 15. In the embodiment shown in FIG. 15, after the sidewall spacers 146 are formed over the sidewalls of the gates 128 and 122 and the gate dielectrics 126 and 120, an ion implantation process 150 and 151 is used to implant a dopant into the first and second regions 104 and 106, respectively (e.g., while the other region not being implanted is covered by a mask), followed by a high temperature anneal process, at a temperature of about 1,000° C. or more, to form deep source and drain implantation regions 152/153 in the source $S_1/S_2$ and drain $D_1/D_2$ regions, as shown. The target depth of this optional ion implantation process is preferably greater than the depth of the dopant bearing metal 140 and doped region 144, in one embodiment, as an example. The deep source and drain implantation regions 152/153 may comprise a depth $d_4$ of about 500 Å or greater beneath the workpiece 102 top surface, for example. The PMOS transistor 136 may be implanted with a dopant 150 comprising $BF_2$, and the NMOS transistor 138 may be implanted with a dopant 151 comprising As, as examples, at an energy level of about 10 KeV at an implantation dosage of about $1\times10^5$ ions/cm², as examples. In some embodiments, the dopant 150 preferably comprises the same dopant type as the first dopant of the first dopant-bearing metal 140, and the dopant 151 preferably comprises the same dopant type as the second dopant of the second dopant-bearing metal 141, as example.

In the embodiment shown in FIG. 16, the resulting transistors 136 and 138 may have a thicker interface region (not shown) than the interface region of the transistors 136 and 138 in FIG. 15, and may also have an additional interface region comprising an oxide formed between the gate dielectrics 126/120 and the gates 128/120 (also not shown), yet the transistors 136 and 138 in FIG. 16 benefit from a further reduction in sheet resistance $R_s$ due to the presence of the dopant-bearing metal 140 and 141 of the source $S_1/S_2$ and drain $D_1/D_2$. This CMOS device 100 is advantageous in some transistor applications that require a deeper source $S_1/S_2$ and drain $D_1/D_2$ implantation process to prevent junction leakage current from the source $S_1/S_2$ and drain $D_1/D_2$ to the workpiece 102, such as in low power applications. In these applications, a higher effective oxide thickness does not deleteriously affect the transistor 136 and 138 performance, for example.

Figure 17:
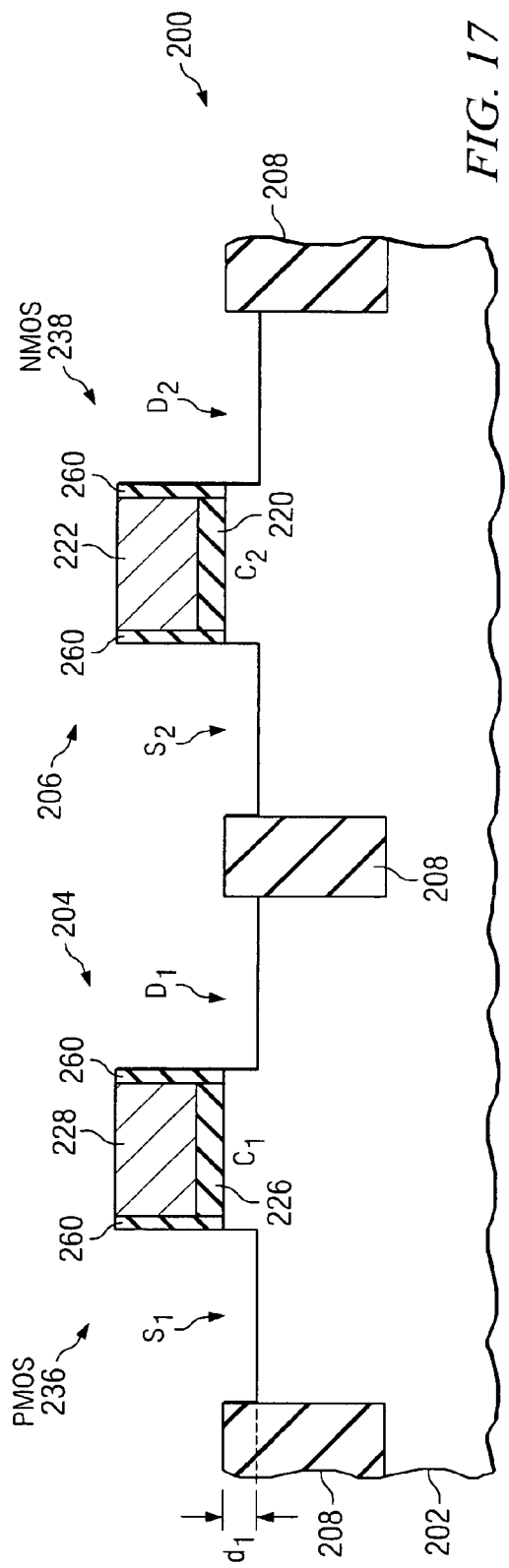
FIGS. 17 through 19 show cross-sectional views of an embodiment of the present invention, wherein a sidewall spacer is formed over sidewalls of the gate dielectric and gate of the first and second transistors before forming the recess for the dopant-bearing metal.
Figure 18:
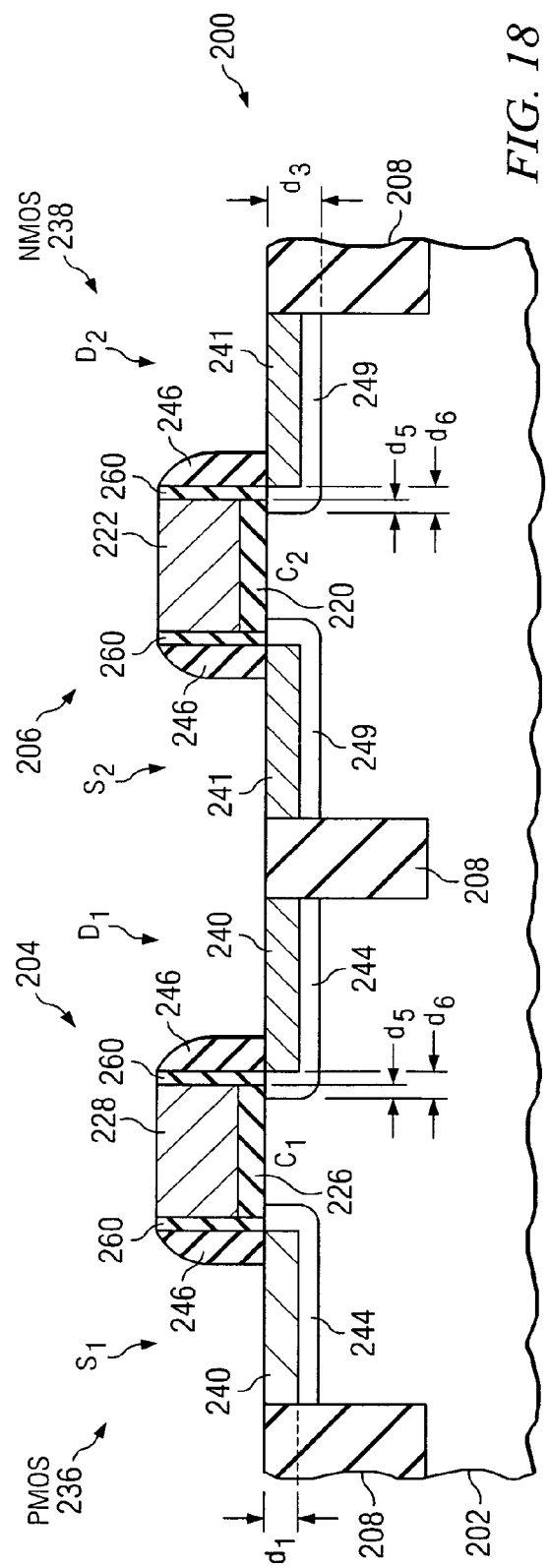
Figure 19:
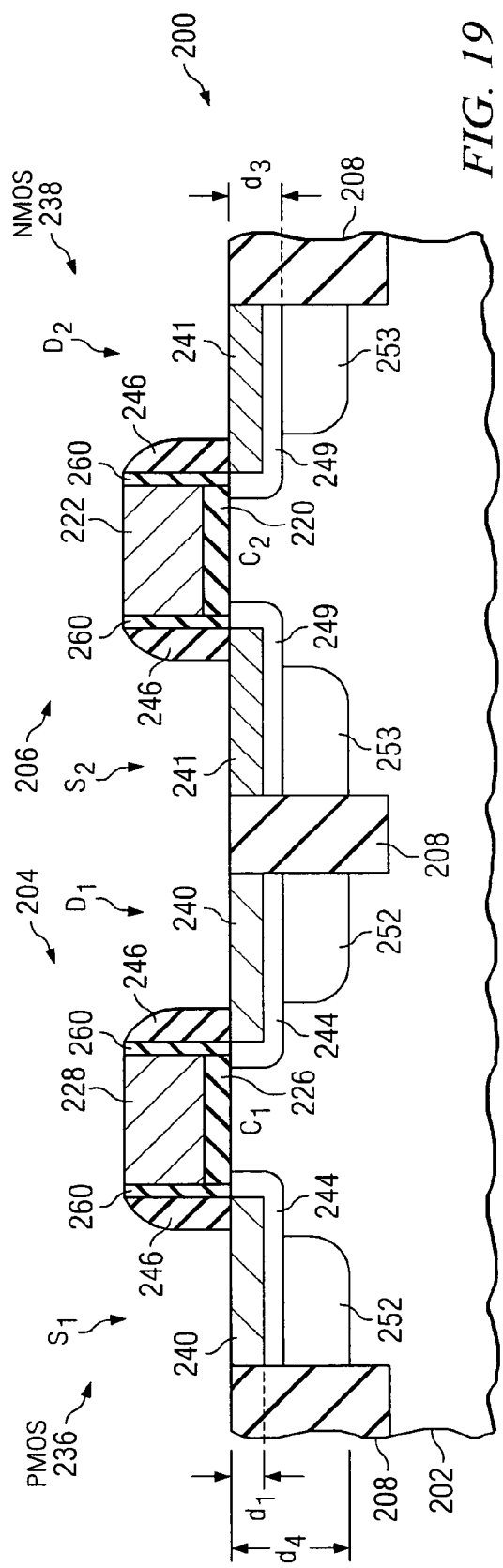

FIGS. 17 through 19 show additional preferred embodiments of the present invention, in which a double spacer 260/246 is used adjacent the gate dielectric and gate, along the sidewalls. A similar process flow and structure may be used as was described for FIGS. 1 through 15 and 16 for the embodiments shown in FIGS. 17 through 18 and 19. Similar reference numbers are designated for the various elements in FIGS. 17 through 18 and 19 as were used in FIGS. 1 through 11 and 12. To avoid repetition, each reference number shown in FIGS. 17 through 18 and 19 is not described in detail herein. Rather, similar materials and thicknesses described for x02, x04, etc. . . . are preferably used for the material layers shown as were described for FIGS. 1 through 11 and 12, where x=1 in FIGS. 1 through 11 and 12 and x=2 in FIGS. 17 through 18 and 19. As an example, the preferred and alternative materials listed for the dopant-bearing metal 140 in the description for FIGS. 1 through 11 and 12 are preferably also used for the dopant-bearing metal 240 in FIG. 18.

FIGS. 17 through 18 show cross-sectional views of a preferred embodiment of the present invention, wherein a first spacer 260 is formed over the sidewalls of the gates 228/222 and gate dielectrics 226/220 before forming the recesses in the source $S_1/S_2$ and drain $D_1/D_2$ regions. The first spacers 260 preferably comprise a thickness of about 50 Å or less, and may comprise an insulating material such as $SiO_2$, SiN, or SiON, as examples. Similar manufacturing processes and materials are used as were described for the embodiment shown in FIGS. 7 through 15, resulting in the formation of transistors 236 and 238 shown in FIG. 18 in a cross-sectional view.

A second spacer 246 is formed adjacent and abutting the first spacers 260, as shown in FIG. 18, after the formation of the source $S_1/S_2$ and drain $D_1/D_2$ regions as described herein. Again, the transistors 236 and 238 have a decreased effective oxide thickness of the gate dielectrics 226/220, and have a junction depth $d_3$ that is well-controlled and very shallow. This embodiment is advantageous in that the extension regions $d_5$ of the source $S_1/S_2$ and drain $D_1/D_2$ regions are further reduced, extending a distance $d_5$ of about 50 Å or less beneath the edge of the gates 228/222 and gate dielectrics 226/220, as shown. For example, the low temperature anneal process results in the formation of the doped regions 244 and 249 that extend less beneath the gates 228/222 and gate dielectrics 226/220 due to the presence of the spacer 260 on the sidewalls of the gates 228/222 and gate dielectrics 226/220. The amount that the extension is reduced is substantially the width of the spacer 260, or the dimension $d_6$ of the thickness of the doped regions 244 and 249 less dimension $d_5$ of the amount that the doped regions 244 and 249 extend beneath the gates 228/222 and gate dielectrics 226/220, for example.

FIG. 19 shows an embodiment of the present invention, wherein a first spacer 260 and second spacer 246 are used, as described for FIGS. 17 and 18. In addition, the workpiece 202 is subjected to a subsequent ion implantation process to form deep source and drain implantation regions 252/253 in the source $S_1/S_2$ and drain $D_1/D_2$, as described with reference to the embodiment shown in FIG. 16. This results in the transistors 236/238 being formed having deep source and drain implantation regions 252 and 253 in the first region 204 and the second region 206, respectively. As described with reference to FIG. 16, the relatively high anneal temperatures required to form the deep source and drain implantation regions 252/253 result in an increased EOT, but this does not present a problem in some applications. The transistors 236 and 238 have a decreased sheet resistance $R_s$.

Figure 20:
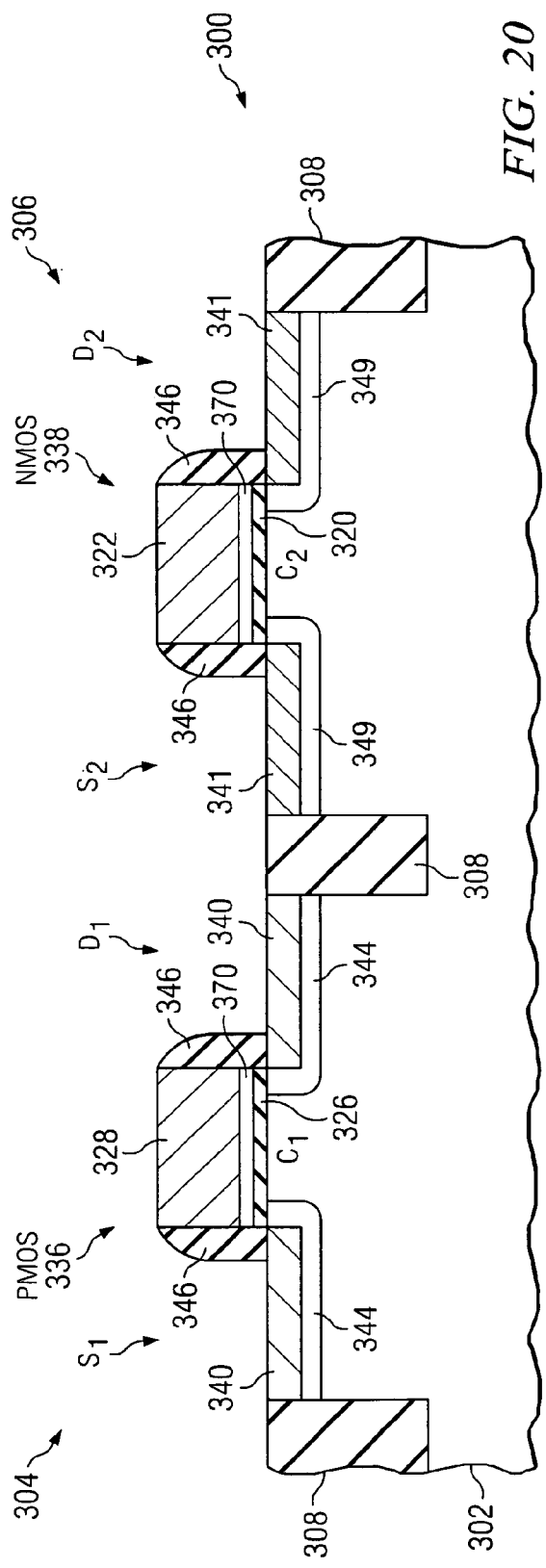
FIG. 20 shows an embodiment of the present invention wherein a thin layer of silicon is formed between the gate dielectric and the gate of the first and second transistors.
Figure 21:
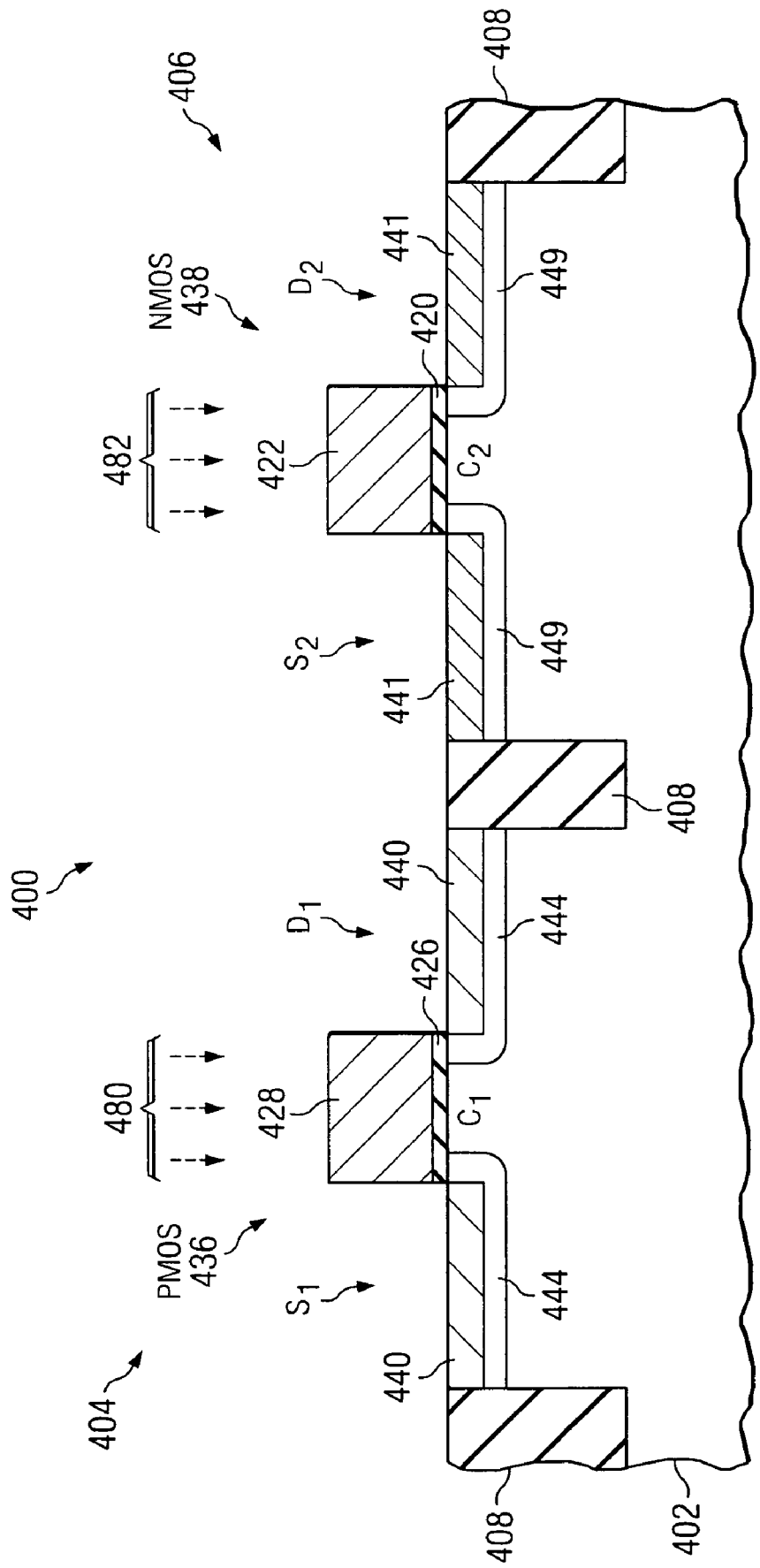
FIG. 21 shows an embodiment of the present invention wherein the gates of the first transistor and the second transistor are doped with different materials.

Additional embodiments of the present invention are shown in a cross-sectional view in FIGS. 20 and 21. Again, similar reference numbers are designated for the various elements in FIGS. 20 and 21 as were used in FIGS. 1 through 15 and 16, and FIGS. 17 through 18 and 19; and to avoid repetition, each reference number shown in FIGS. 20 and 21 is not described in detail herein. Rather, similar materials and thicknesses described for x02, x04, etc. . . . are preferably used for the material layers shown as were described for FIGS. 1 through 15 and 16, and FIGS. 17 through 18 and 19, where x=1 in FIGS. 1 through 15 and 16, x=2 in FIGS. 17 through 18 and 19, x=3 in FIG. 20, and x=4 in FIG. 21.

In the embodiment shown in FIG. 20, a thin layer of silicon 370 may be formed between the gate dielectric 320 and 326 and the gate 322 and 328 of the transistors 338 and 336 in accordance with embodiments of the present invention, as described in U.S. patent application Ser. No. 11/005,292, filed on Dec. 6, 2004, entitled, "CMOS Transistor and Method of Manufacture Thereof," which is incorporated herein by reference. For example, after forming the gate dielectric materials 320 and 326, a thin layer of silicon 370 is formed over the gate dielectric materials 320 and 326, before depositing the gate materials 322 and 328, respectively. The thin layer of silicon 370 may provide pinning of the work function of the PMOS transistor 336 and the NMOS transistor 338, for example.

Furthermore, in another embodiment, dopants 480 and 482 may be implanted into the gates 428 and 422 of the transistors 436 and 438, as shown in FIG. 21. The dopants 480 and 482 may comprise the same dopant species or different dopant species, for example. The PMOS transistor 436 gate may be implanted with an N type dopant, and the NMOS transistor 438 gate may be implanted with a P or N type dopant, as described in Ser. No. 11/017,062, filed on Dec. 20, 2004, entitled, "Transistor Device and Method of Manufacture Thereof," which is incorporated herein by reference. An advantage of these embodiments is the reduction of a "poly depletion" effect that can occur when polysilicon is used as a gate electrode material. A poly depletion effect can increase the inversion oxide thickness ($T_{inv}$) (or capacitance equivalent thickness (CET)) of a transistor by about 4 Å, for example, which results in decreasing the device performance significantly, e.g., by about 20%. In addition, using N type dopant in PMOS transistors can eliminate a boron penetration effect (e.g., which can occur when a polysilicon gate electrode is implanted with boron, because boron diffuses from the gate and into the gate dielectric and/or channel region of the workpiece), which can deteriorate the gate dielectric quality and also increase the off-state leakage current. Furthermore, using polysilicon as a gate electrode material is an advantage, because manufacturing processes using polysilicon materials are mature, making these embodiments more manufacturing-friendly and easily integratable into production processes. However, alternatively, the PMOS transistor 436 gate may be implanted with a P type dopant, and the NMOS transistor 438 may be implanted with an N type dopant, for example. The first region 404 of the workpiece 402 may be masked (not shown) while the second region 406 is implanted with the dopant 482, and vice versa, for example.

Note that the various embodiments described herein may be used in combination. For example, the sidewall spacers described in FIGS. 17 and 18, and the deep implantation regions described in FIG. 19, may also be implemented in the embodiments shown in FIGS. 20 and 21.

Advantages of embodiments of the invention include providing novel CMOS devices and methods of manufacturing thereof. The work functions of the CMOS transistors described herein are tunable by a wide variety of factors, such as the gate dielectric material, gate material, doping, and optional thin layer of silicon. The junction depth $X_j$ (e.g., of the source and drain regions $S_1/S_2$ and $D_1/D_2$) is reduced, and the effective oxide thickness is reduced, of the novel transistors and CMOS devices described herein.

Embodiments of the present invention provide novel CMOS device structures and methods of manufacture thereof that combine a "dual high-k" structure wherein the PMOS gate dielectric and NMOS gate dielectric comprise different materials, with a "metal junction" structure wherein the source and drain regions comprise a dopant-bearing metal. Advantages of embodiments of the present invention include providing improved EOT scaling because of the lower thermal budget of the metal junction formation process than in traditional implant-anneal junction processes (e.g., used to form source and drain regions). Because of the lower thermal budget, high temperature anneal processes are not required to form the source and drain regions of the transistors, and more band-edge metal gate materials may be used. For example, the work function of metals is a function of the process temperature. Many materials that exhibit band-edge work functions at a low temperature (e.g., less than about 900° C.) become near-mid-gap materials after a high temperature source/drain activation anneal (e.g., of greater than about 900° C.) and therefore, the use of band-edge metals has not been very successful in the prior art, for example. By lowering the thermal process temperature by the use of the novel embodiments of the present invention described herein, there are more choices of the metals that can be used in production, e.g., for the gate electrode and source and drain region materials. Furthermore, by using a dopant-bearing metal in the source and drain regions, the drive current of the transistors is increased (and hence, the circuit speed is increased), the short channel effect is reduced, and junction leakage current is also reduced, as examples.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   providing a workpiece;
   forming a first gate dielectric material over the workpiece in a first region of the workpiece;
   forming a second gate dielectric material over the workpiece in a second region of the workpiece, the second gate dielectric material comprising a different material than the first gate dielectric material;
   patterning the first gate dielectric material and the second gate dielectric material to form a first gate dielectric of a first transistor and a second gate dielectric of a second transistor;
   forming recesses in the workpiece proximate the first gate dielectric and the second gate dielectric;
   filling the recesses in the workpiece proximate the first gate dielectric with a first dopant-bearing metal, the first dopant-bearing metal comprising a first dopant;
   filling the recesses in the workpiece proximate the second gate dielectric with a second dopant-bearing metal, the second dopant-bearing metal comprising a second dopant, the second dopant being different than the first dopant; and
   annealing the workpiece, causing diffusion of the first dopant and second dopant into the workpiece, forming first doped regions within the workpiece adjacent the first dopant-bearing metal and second doped regions within the workpiece adjacent the second dopant-bearing metal, wherein the first dopant-bearing metal and the first doped regions comprise a source region and a drain region of the first transistor, and wherein the second dopant-bearing metal and the second doped regions comprise a source region and a drain region of the second transistor.

2. The method according to claim 1, further comprising forming a first gate material over the first gate dielectric material and forming a second gate material over the second dielectric material, wherein forming the first gate dielectric material and forming the first gate material comprise forming a hard mask over the second region of the workpiece, depositing the first gate dielectric material over the hard mask in the second region and over the first region, depositing the first gate material over the first gate dielectric material, and removing the first gate material, first gate dielectric material, and the hard mask from over the second region of the workpiece, leaving the first gate material and the first gate dielectric material residing over the first region of the workpiece; and wherein forming the second gate dielectric material and forming the second gate material comprise depositing the second gate dielectric material over the second region of the workpiece and over the first gate material over the first region of the workpiece, depositing the second gate material over the second gate dielectric material, and removing the second gate material and the second gate dielectric material from over the first region of the workpiece, leaving the second gate material and the second gate dielectric material over the second region of the workpiece.

3. The method according to claim 1, wherein forming the first gate dielectric material comprises forming a first dielectric material over the workpiece, removing the first gate dielectric material from over the first region of the workpiece, and forming a second dielectric material over the workpiece in the first region and over the first dielectric material in the second region, wherein the first gate dielectric material comprises the second dielectric material, and wherein the second gate dielectric material comprises the first dielectric material and the second dielectric material.

4. The method according to claim 1, wherein forming the first gate dielectric material and forming the second gate dielectric material comprise depositing an insulating layer over the entire top surface of the workpiece, wherein forming the first gate material and forming the second gate material comprise depositing a conductive layer over the insulating layer, further comprising:
    implanting a Fermi-pinning material into at least the conductive layer over the first region of the workpiece.

5. The method according to claim 4, wherein implanting the Fermi-pinning material into at least the conductive layer over the first region of the workpiece comprises implanting the Fermi-pinning material into the insulating layer.

6. The method according to claim 1, wherein the first transistor is formed in a first region of the workpiece and the second transistor is formed in a second region of the workpiece, wherein filling the recesses in the workpiece proximate the first gate dielectric with the first dopant-bearing metal comprises masking the second region with a first mask, depositing the first dopant-bearing metal over the first transistor in the first region and over the first mask in the second region, removing a portion of the first dopant-bearing metal from over a top surface of the workpiece in the first region, and removing the first dopant-bearing metal and the first mask from over the second region; and wherein filling the recesses in the workpiece proximate the second gate dielectric with the second dopant-bearing metal comprises masking the first region of the workpiece with a second mask, depositing the second dopant-bearing metal over the second transistor in the second region and over the second mask in the first region, removing a portion of the second dopant-bearing metal from over a top surface of the workpiece in the second region, and removing the second dopant-bearing metal and the second mask from over the first region.

7. The method according to claim 1, wherein the first transistor is formed in a first region of the workpiece and the second transistor is formed in a second region of the workpiece, wherein filling the recesses in the workpiece proximate the first gate dielectric with the first dopant-bearing metal and filling the recesses in the workpiece proximate the second gate dielectric with the second dopant-bearing metal comprise depositing a single metal layer over the first region and the second region, implanting the first dopant into the single metal layer in the first region, and implanting the second dopant into the single metal layer in the second region.

8. The method according to claim 7, further comprising masking the single metal layer in the second region with a first mask, before implanting the first dopant into the single metal layer in the first region, and removing the first mask from over the second region, and further comprising masking the single metal layer in the first region with a second mask, before implanting the second dopant into the single metal layer in the second region, and removing the second mask.

9. The method according to claim 8, further comprising removing a portion of the single metal layer from over at least a top surface of the workpiece, before implanting the first dopant and the second dopant.

10. The method according to claim 9, further comprising forming a first gate material over the first gate dielectric material and forming a second gate material over the second gate dielectric material, wherein implanting the first dopant comprises implanting the first dopant into the first gate material, and wherein implanting the second dopant comprises implanting the second dopant into the second gate material.

11. A method of manufacturing a complementary metal oxide semiconductor (CMOS) device, the method comprising:
    providing a workpiece;
    forming a first gate dielectric material over the workpiece in a first region of the workpiece, the first gate dielectric material comprising a dielectric material having a dielectric constant of about 4.0 or greater;
    forming a second gate dielectric material over the workpiece in a second region of the workpiece, the second gate dielectric material comprising a dielectric material having a dielectric constant of about 4.0 or greater and comprising a different material than the first gate dielectric material;
    patterning the first gate dielectric material and the second gate dielectric material to form a first gate dielectric of a p channel MOS (PMOS) transistor and a second gate dielectric of an n channel MOS (NMOS) transistor;
    forming two recesses in the workpiece proximate each of the first gate dielectric and the second gate dielectric;
    filling the recesses in the workpiece proximate the first gate dielectric with a first dopant-bearing metal;
    filling the recesses in the workpiece proximate the second gate dielectric with a second dopant-bearing metal, the second dopant-bearing metal comprising a different dopant than the first dopant-bearing metal; and
    annealing the workpiece, causing diffusion of a first dopant of the first dopant-bearing metal into the workpiece, forming first doped regions within the workpiece adjacent the first dopant-bearing metal, wherein the first dopant-bearing metal and the first doped regions comprise a source region and drain region of the PMOS transistor, and causing diffusion of a second dopant of the second dopant-bearing metal into the workpiece, forming second doped regions within the workpiece adjacent the second dopant-bearing metal, wherein the second dopant-bearing metal and the second doped regions comprise a source region and drain region of the NMOS transistor.

12. The method according to claim 11, further comprising forming a sidewall spacer on sidewalls of at least the first gate dielectric and the second gate dielectric, before forming the recesses in the workpiece.

13. The method according to claim 11, wherein the first dopant-bearing metal comprises a first dopant, wherein the second dopant-bearing metal comprises a second dopant, further comprising after annealing the workpiece, forming sidewall spacers on sidewalls of at least the first gate dielectric and the second gate dielectric, implanting ions of a third dopant into the source and drain region of the PMOS transistor, implanting ions of a fourth dopant into the source and drain region of the NMOS transistor, and annealing the workpiece again to form a first deep implantation region beneath the first doped region and to form a second deep implantation region beneath the second doped region.

14. The method according to claim 11, wherein annealing the workpiece comprises annealing the workpiece at a temperature of about 900° C. or less for about 1 hour or less.

15. The method according to claim 11, wherein forming the recesses comprises forming recesses having a depth of about 200 Å or less.

16. The method according to claim 11, further comprising forming a first gate material over the first gate dielectric material and forming a second gate material over the second dielectric material, wherein the forming the first gate material and forming the second gate material comprise depositing polysilicon, further comprising:

doping the first gate with a P type dopant or an N type dopant, after forming the first gate material, and;

doping the second gate with a P type or N type dopant, after forming the second gate material, wherein the first gate and the second gate are doped with the same dopant type or a different dopant type.

* * * * *

UNITED STATES PATENT AND TRADEMARK OFFICE
CERTIFICATE OF CORRECTION

PATENT NO. : 7,510,943 B2
APPLICATION NO. : 11/305567
DATED : March 31, 2009
INVENTOR(S) : Li Page 1 of 1

It is certified that error appears in the above-identified patent and that said Letters Patent is hereby corrected as shown below:

On the Title Page, Item (56) References Cited, OTHER PUBLICATIONS, Page 2, Col. 2, 4th entry, delete extra space within Dielectric.
In Col. 5, line 10, before patterned insert --be--.
In Col. 7, line 1, before patterned insert --be--.
In Col. 9, line 25, delete "120" and insert --122--.
In Col. 9, line 26, delete "122" and insert --120--.
In Col. 9, line 26, delete "126" and insert --128--.
In Col. 9, line 27, delete "128" and Insert --126--.
In Col. 12, line 34, delete "106" and Insert --104--.
In Col. 15, line 15, delete "$1X10^5$" and insert --$1X10^{15}$--.
In Col. 15, line 26, delete "128/120" and insert --128/122--.

Signed and Sealed this

Seventh Day of July, 2009

JOHN DOLL
*Acting Director of the United States Patent and Trademark Office*